(12) United States Patent
Nomura et al.

(10) Patent No.: US 6,687,459 B2
(45) Date of Patent: Feb. 3, 2004

(54) FPC MOUNTING STRUCTURE

(75) Inventors: Hiroshi Nomura, Saitama (JP); Takamitsu Sasaki, Saitama (JP); Kazunori Ishizuka, Kanagawa (JP); Maiko Takashima, Tokyo (JP)

(73) Assignee: Pentax Corporation, Tokyo (JP)

( * ) Notice: Subject to any disclaimer, the term of this patent is extended or adjusted under 35 U.S.C. 154(b) by 0 days.

(21) Appl. No.: 10/101,314

(22) Filed: Mar. 21, 2002

(65) Prior Publication Data

US 2002/0136546 A1 Sep. 26, 2002

(30) Foreign Application Priority Data

Mar. 22, 2001 (JP) .................................. 2001-082924

(51) Int. Cl.⁷ .............................................. G03B 17/00
(52) U.S. Cl. ...................... 396/72; 396/462; 396/542
(58) Field of Search .................. 396/542, 72, 451, 396/462

(56) References Cited

U.S. PATENT DOCUMENTS

| | | | |
|---|---|---|---|
| 4,227,792 A | 10/1980 | Rentschler | |
| 4,390,262 A | 6/1983 | Hirohata et al. | |
| 4,416,527 A | 11/1983 | Okura | |
| 4,426,145 A | 1/1984 | Hashimoto | |
| 4,484,800 A | 11/1984 | Tamura | |
| 4,576,446 A | 3/1986 | Kamata | |
| 4,595,081 A | 6/1986 | Parsons | |
| 4,662,241 A | 5/1987 | Edwards | |
| 4,834,514 A | 5/1989 | Atsuta et al. | |
| 4,839,680 A | 6/1989 | Amada et al. | |
| 4,922,274 A | 5/1990 | Yamamoto et al. | |
| 4,944,030 A | 7/1990 | Haraguchi et al. | 396/62 |
| 4,971,427 A | 11/1990 | Takamura et al. | |
| 4,993,815 A | 2/1991 | Yamazaki et al. | |
| 5,037,187 A | 8/1991 | Oda et al. | 359/699 |
| 5,051,764 A | 9/1991 | Nomura | 396/462 |
| 5,079,577 A | 1/1992 | Nomura | 396/72 |
| 5,126,883 A | 6/1992 | Sato et al. | 359/683 |
| 5,166,829 A | 11/1992 | Iizuka | |
| 5,177,638 A | 1/1993 | Emura et al. | 359/704 |
| 5,196,963 A | 3/1993 | Sato et al. | 359/699 |
| 5,241,422 A | 8/1993 | Shimada et al. | |
| 5,268,794 A | 12/1993 | Chan | 359/399 |
| 5,301,066 A | 4/1994 | Higuchi et al. | 359/698 |
| 5,327,184 A | 7/1994 | Nomura et al. | 396/87 |
| 5,461,443 A | 10/1995 | Nakayama et al. | |
| 5,559,571 A * | 9/1996 | Miyamoto et al. | 396/542 X |
| 5,583,596 A | 12/1996 | Haraguchi et al. | 396/85 |
| 5,589,987 A | 12/1996 | Tanaka | 359/701 |
| 5,701,208 A | 12/1997 | Sato et al. | 359/822 |
| 5,739,962 A | 4/1998 | Asakura et al. | 359/700 |
| 5,774,266 A | 6/1998 | Otani et al. | 359/554 |
| 5,809,361 A | 9/1998 | Nomura et al. | 396/542 |
| 5,812,889 A | 9/1998 | Nomura et al. | 396/87 |
| 5,826,126 A | 10/1998 | Nomura et al. | 396/542 |
| 5,870,232 A | 2/1999 | Tsuji et al. | 359/700 |
| 5,892,998 A | 4/1999 | Kodaira et al. | |
| 5,933,285 A | 8/1999 | Sato et al. | 359/694 |

(List continued on next page.)

FOREIGN PATENT DOCUMENTS

JP 4-340907 11/1992 ............ G02B/7/02

*Primary Examiner*—W. B. Perkey
(74) *Attorney, Agent, or Firm*—Greenblum & Bernstein, P.L.C.

(57) ABSTRACT

An FPC mounting structure for a lens shutter having a lens-shutter unit having therein a photographing lens and a shutter, and an FPC which is adapted to connect the lens-shutter unit to a control circuit, includes a circumferentially extending FPC which is supported along an outer surface of the lens-shutter unit, and an axially extending FPC which extends in the optical axis direction and which is connected to the control circuit. The circumferentially extending FPC and the axially extending FPC are constructed separately and are connected to each other in a press-contact state.

13 Claims, 28 Drawing Sheets

U.S. PATENT DOCUMENTS

| | | |
|---|---|---|
| 6,069,745 A | 5/2000 | Fujii et al. .................... 359/694 |
| 6,089,760 A | 7/2000 | Terada |
| 6,118,666 A * | 9/2000 | Aoki et al. ............. 396/542 X |
| 6,125,237 A | 9/2000 | Park |
| 6,160,670 A | 12/2000 | Nakayama et al. ......... 359/696 |
| 6,176,627 B1 | 1/2001 | Suh |
| 6,195,211 B1 | 2/2001 | Iwasaki ...................... 359/694 |
| 6,522,478 B2 | 2/2002 | Nomura et al. ............. 359/694 |
| 6,522,481 B2 | 2/2002 | Nomura et al. ............. 359/699 |
| 6,522,482 B2 | 2/2002 | Nomura et al. ............. 359/701 |
| 6,369,955 B1 | 4/2002 | Enomoto et al. ........... 359/685 |
| 6,424,469 B2 | 7/2002 | Hirai ......................... 359/699 |
| 6,429,979 B2 | 8/2002 | Enomoto ..................... 359/692 |
| 6,437,922 B2 | 8/2002 | Enomoto et al. ............ 359/685 |
| 6,437,924 B1 | 8/2002 | Azegami ..................... 359/694 |
| 6,456,442 B1 | 9/2002 | Enomoto ..................... 359/389 |
| 6,456,445 B2 | 9/2002 | Nomura et al. ............. 359/699 |
| 6,469,840 B2 | 10/2002 | Nomura et al. ............. 359/699 |
| 6,469,841 B2 | 10/2002 | Nomura et al. ............. 359/699 |
| 6,493,511 B2 * | 12/2002 | Sato ............................ 396/72 |
| 6,512,638 B2 | 1/2003 | Sato et al. .................. 359/701 |
| 2002/0012178 A1 | 1/2002 | Noguchi ..................... 359/811 |
| 2002/0036836 A1 | 3/2002 | Hagimori ................... 359/694 |

\* cited by examiner

Fig. 8
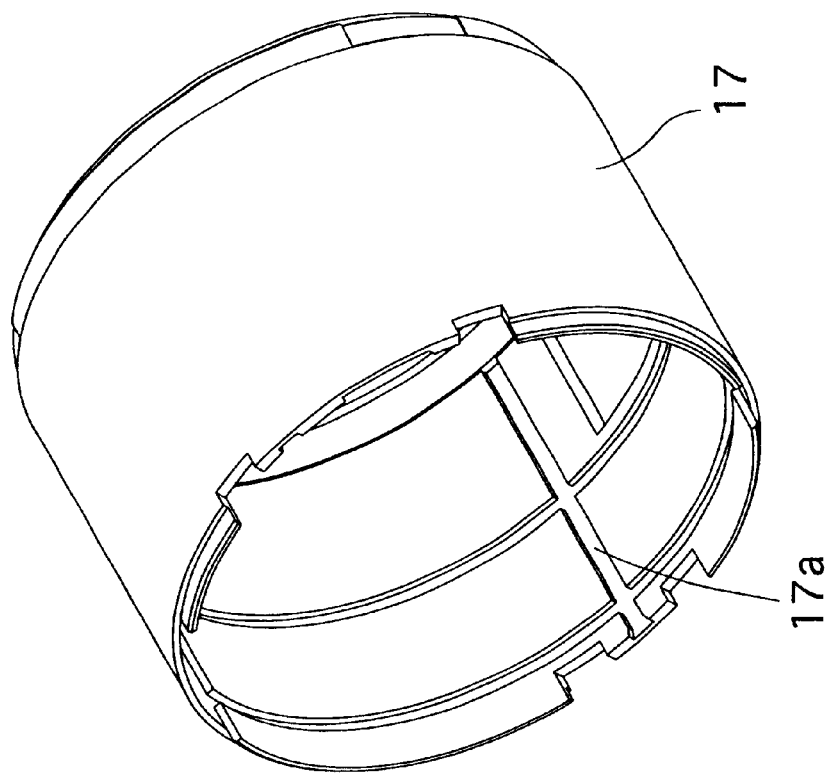
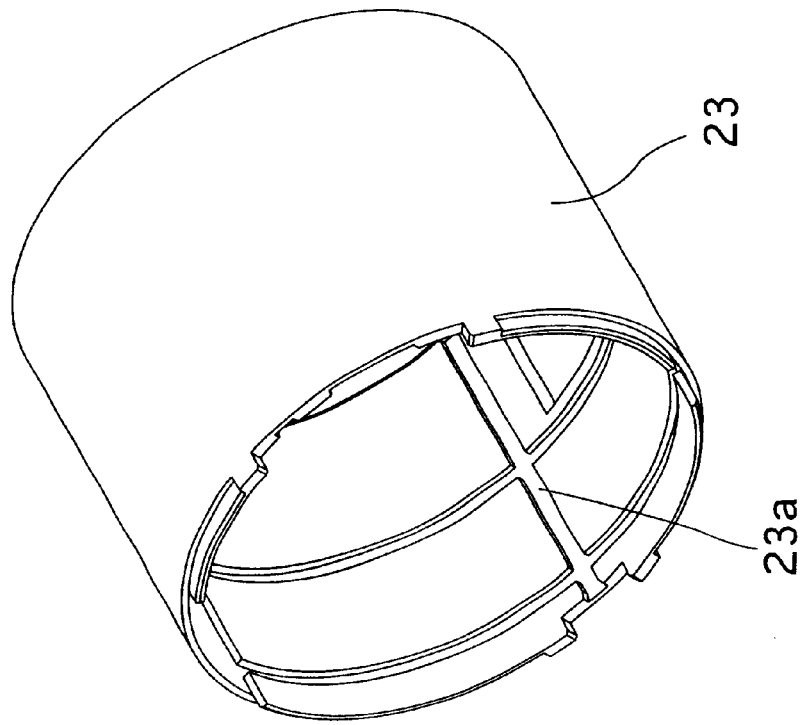

FPC MOUNTING STRUCTURE

BACKGROUND OF THE INVENTION

1. Field of the Invention

The present invention relates to an FPC (Flexible Printed Circuit) mounting structure for a lens shutter, etc.

2. Description of the Related Art

In a known lens shutter camera, a focusing lens group or a shutter are incorporated in a lens-shutter unit (photographing-function unit), and electric devices, such as a motor or sensors, in the lens-shutter unit are, in general, electrically connected to a control circuit of the camera via an FPC. However, the FPC can hinder the assembly or disassembly of the lens-shutter unit.

In the case of an FPC for a lens shutter of a zoom lens camera, since the lens-shutter unit is moved during the zooming operation, the FPC connecting the lens-shutter unit and the control circuit must be flexible enough to easily deform or bend in accordance with the zooming operation. However, the portion of the FPC which is secured to the electric devices of the lens-shutter unit must be rigid enough to stably and effectively place the electric devices, and must be rigid enough so as to prevent the FPC from slipping off. However, it is difficult for a conventional FPC for a lens shutter to meet such contradictory requirements.

SUMMARY OF THE INVENTION

The present invention provides a mounting structure of an FPC which is adapted to connect the photographing-function unit, such as a lens shutter and the control circuit, in which the assembling and disassembling operations can be facilitated.

An FPC mounting structure which is particularly useful for an arrangement in which a photographing-function unit, such as a lens shutter, is moved relative to the control circuit, is also provided.

For example, in an embodiment, an FPC mounting structure is provided for a lens shutter including a lens-shutter unit having therein a photographing lens and a shutter, and an FPC which is adapted to connect the lens-shutter unit to a control circuit, the FPC including a circumferentially extending FPC which is supported along an outer peripheral surface of the lens-shutter unit; and an axially extending FPC which extends in the optical axis direction and which is connected to the control circuit. The circumferentially extending FPC and the axially extending FPC are constructed separately and are connected to each other in a press-contact state.

It is desirable for the circumferentially extending FPC to be a double-sided FPC which is provided on upper and lower surfaces thereof with printed circuits, and for the axially extending FPC to be a single-sided FPC which is provided on one surface thereof with a printed circuit.

The circumferentially extending FPC and the axially extending FPC can be secured to the lens-shutter unit by a common screw in press-contact state.

The FPC mounting structure for a lens shutter can further include a cover member which is attached to an outer peripheral surface of the lens-shutter unit to hold the circumferentially extending FPC to the outer peripheral surface of the lens-shutter unit.

The lens-shutter unit can include a lens drive motor which moves the photographing lens in the optical axis direction within the lens-shutter unit; a lens movement detection device which detects the position of the photographing lens moved by the lens drive motor; a shutter drive motor which opens and closes the shutter; and a shutter opening detection device which detects the opening state of the shutter. The circumferentially extending FPC is connected to the lens drive motor, the lens movement detection device, the shutter drive motor, and the shutter opening detection device.

The lens-shutter unit can be provided in a zoom lens barrel so as to move in the optical axis direction by a zooming operation of the zoom lens barrel. The axially extending FPC can be provided with at least one pair of straight portions which extend in the optical axis direction and at least one folded portion which connects with said pair of straight portions, wherein the position of the folded portion is varied in accordance with the movement of the lens-shutter unit in the optical axis direction.

In another embodiment, an FPC mounting structure is provided, in which a photographing-function unit which has at least one of a photographing lens movable in the optical axis direction and an exposure control member, connected to a control circuit which controls the photographing-function unit via an FPC, the FPC including a circumferentially extending FPC which is supported along an outer peripheral surface of the photographing-function unit, and an axially extending FPC which extends in the optical axis direction and is connected to the control circuit. The circumferentially extending FPC and the axially extending FPC are constructed separately and are connected to each other in a press-contact state.

The circumferentially extending FPC can be a double-sided FPC which is provided on the upper and lower surfaces thereof with printed circuits, and the axially extending FPC can be a single-sided FPC which is provided on one surface thereof with a printed circuit.

The circumferentially extending FPC and the axially extending FPC can be secured to the photographing-function unit by a common screw in a press-contact state.

The FPC mounting structure can further include a cover member which is attached to the outer peripheral surface of the photographing-function unit to hold the circumferentially extending FPC to the outer peripheral surface of the photographing-function unit.

The exposure control member can be a shutter or a diaphragm. Alternatively, the exposure control member can include a shutter and a diaphragm.

The present disclosure relates to subject matter contained in Japanese Patent Application No.2001-82924 (filed on Mar. 22, 2001) which is expressly incorporated herein by reference in its entirety.

BRIEF DESCRIPTION OF THE DRAWINGS

The invention will be discussed below with reference to the accompanying drawings, in which:

FIG. 8 is a perspective view of first and second outer barrels;

DESCRIPTION OF THE PREFERRED EMBODIMENTS

The following embodiments are addressed to a zoom lens barrel to which an FPC (flexible printed circuit) mounting structure is applied. The structure of the zoom lens barrel is discussed first and the features of the present invention including the FPC mounting structure is discussed thereafter.

Figure 1:
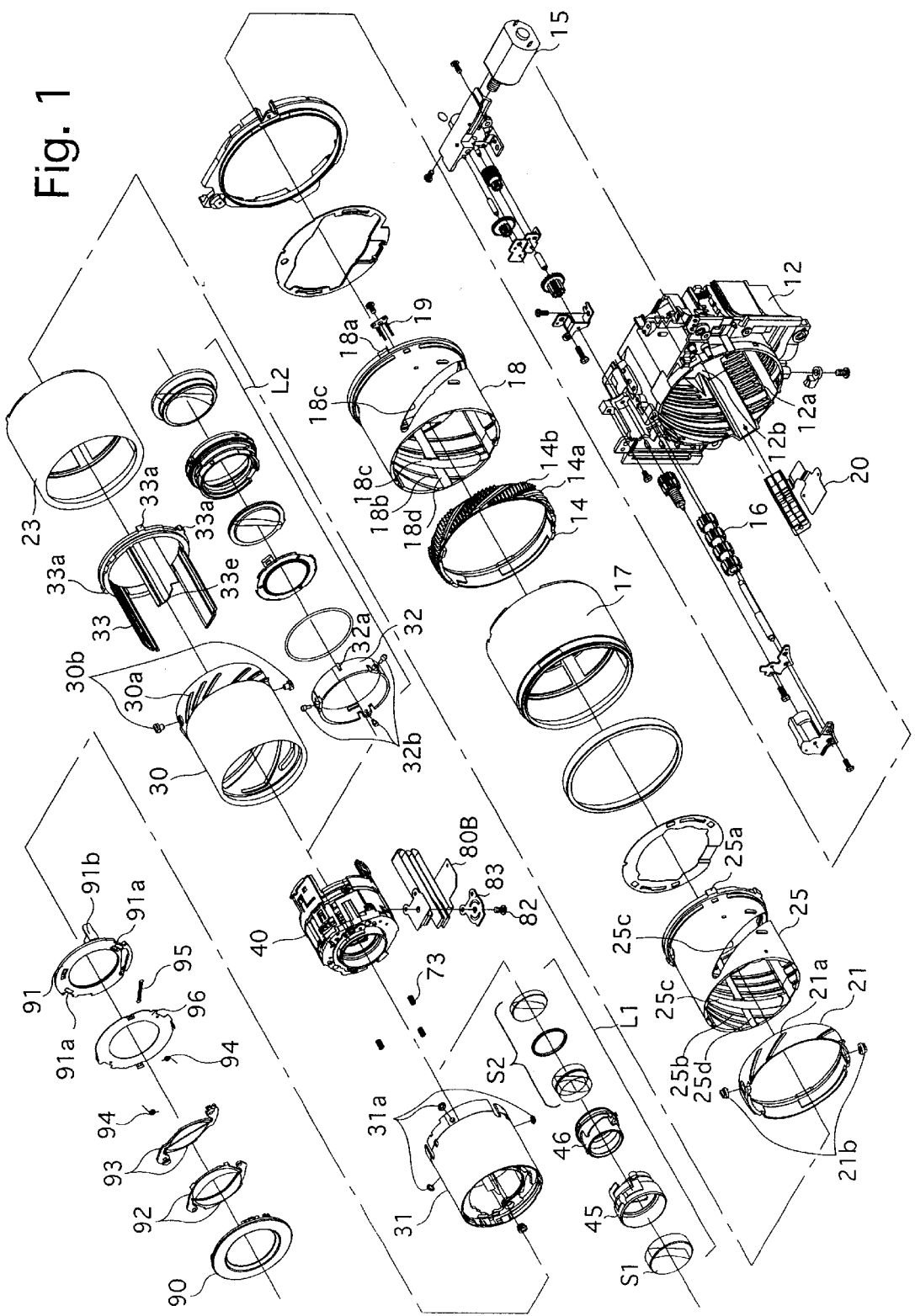
FIG. 1 is an exploded perspective view of components of a zoom lens barrel, according to the present invention.

As shown in FIG. 1, a stationary barrel 12 secured to a camera body 11 is provided on its inner peripheral surface with a female helicoid 12a which is screw-engaged with a male helicoid 14a formed on an outer peripheral surface of a first helicoid ring 14. A pinion 16 which is rotated by a zooming motor 15 is provided outside the stationary barrel 12. The pinion 16 is in mesh with a gear 14b formed on the outer peripheral surface of the first helicoid ring 14 via a cut-out portion of the male helicoid 14a. The gear 14b is inclined in the same direction as the lead of the male helicoid 14a. The first helicoid ring 14 is connected at the front end thereof to a first outer barrel 17. Consequently, when the first helicoid ring 14 is rotated in the forward or reverse direction by the zooming motor 15, the first helicoid ring 14 and the first outer barrel 17, integrally connected thereto, are moved in the optical axis direction in accordance with the engagement of the female helicoid 12 and the male helicoid 14a.

A first linear guide ring 18 which is rotatable relative to, and movable together with, the first outer barrel 17 in the optical axis direction (i.e., not relatively movable with respect to the first outer barrel 17 in the optical axis direction) is supported in the inner periphery of the first outer barrel 17. The first linear guide ring 18 has a projection 18a which is engaged in a linear guide groove 12b of the stationary barrel 12, so that the first linear guide ring 18 is linearly movable only in the optical axis direction. The axial displacement of the first linear guide ring 18 is detected by a brush 19 and a code plate 20 secured to the first linear guide ring 18 and the stationary barrel 12, respectively.

The first linear guide ring 18 is provided on the inner peripheral surface thereof with a female helicoid 18b which is engaged with a male helicoid 21a formed on an outer peripheral surface of a second helicoid ring 21. The second helicoid ring 21 is provided on the outer peripheral surface thereof with a pair of guide portions 21b which are engaged in guide grooves 17a (see FIG. 8) formed in the inner peripheral surface of the first outer barrel 17 through guide through-grooves 18c formed in the first linear guide ring 18. The guide through-grooves 18c are elongated through-holes inclined in the same direction as the female helicoid 18b, and the guide grooves 17a are linear grooves parallel with the optical axis O of the zoom lens system. The second helicoid ring 21 is connected at the front end thereof to a second outer barrel 23. Consequently, when the first outer barrel 17 is rotated in the forward or reverse direction by the zooming motor 15, the second helicoid ring 21 and the second outer barrel 23, integrally connected thereto, are rotated in accordance with the engagement between the guide portion grooves 17a and the guide portions 21b, and accordingly, are moved in the optical axis direction with respect to the first linear guide ring 18 (and an assembly of the first outer barrel 17 and the first helicoid ring 14) in accordance with the female helicoid 18b and the male helicoid 21a.

A second linear guide ring 25 which is rotatable relative to, and is movable in the optical axis direction together with, the second outer barrel 23 (i.e., not movable in the optical axis direction relative to the second outer barrel 23) is supported in the second outer barrel 23. The second linear guide ring 25 has a projection 25a which is engaged in a linear guide groove 18d of the first linear guide ring 18, so that the second linear guide ring 25 is linearly movable only in the optical axis direction.

Similar to the first linear guide ring 18, the second linear guide ring 25 is provided on the inner peripheral surface thereof with a female helicoid 25b which is engaged with a male helicoid 30a formed on an outer peripheral surface of a rear end of a cam ring (third outer barrel) 30. The cam ring 30 is provided on the outer peripheral surface thereof with a pair of guide portions 30b which are engaged in guide grooves 23a (see FIG. 8) formed in the inner peripheral surface of the second outer barrel 23 through guide through-grooves 25c formed in the second linear guide ring 25. The guide through-grooves 25c are in the form of elongated through-holes inclined in the same direction as the female helicoid 25b, and the guide grooves 23a are in the form of linear grooves parallel with the optical axis O. Consequently, when the second outer barrel 23 is rotated in the forward or reverse direction by the zooming motor 15, the cam ring 30 is moved in the optical axis direction relative to the second linear guide ring 25 (and an assembly of the second outer barrel 23 and the second helicoid ring 21), in accordance with the engagement between the female helicoid 25b and the male helicoid 30a.

A third linear guide ring 33 which is rotatable relative to, and is movable in, the optical axis direction together with the cam ring 30 (i.e., not movable in the optical axis direction relative to the cam ring 30) is supported in the cam ring 30. The third linear guide ring 33 is provided on the outer peripheral surface thereof with a plurality of linear guide projections 33a which are engaged in a linear guide groove 25d formed on the inner peripheral surface of the second linear guide ring 25, so that the third linear guide ring 33 is linearly movable only in the optical axis direction.

Figure 9:
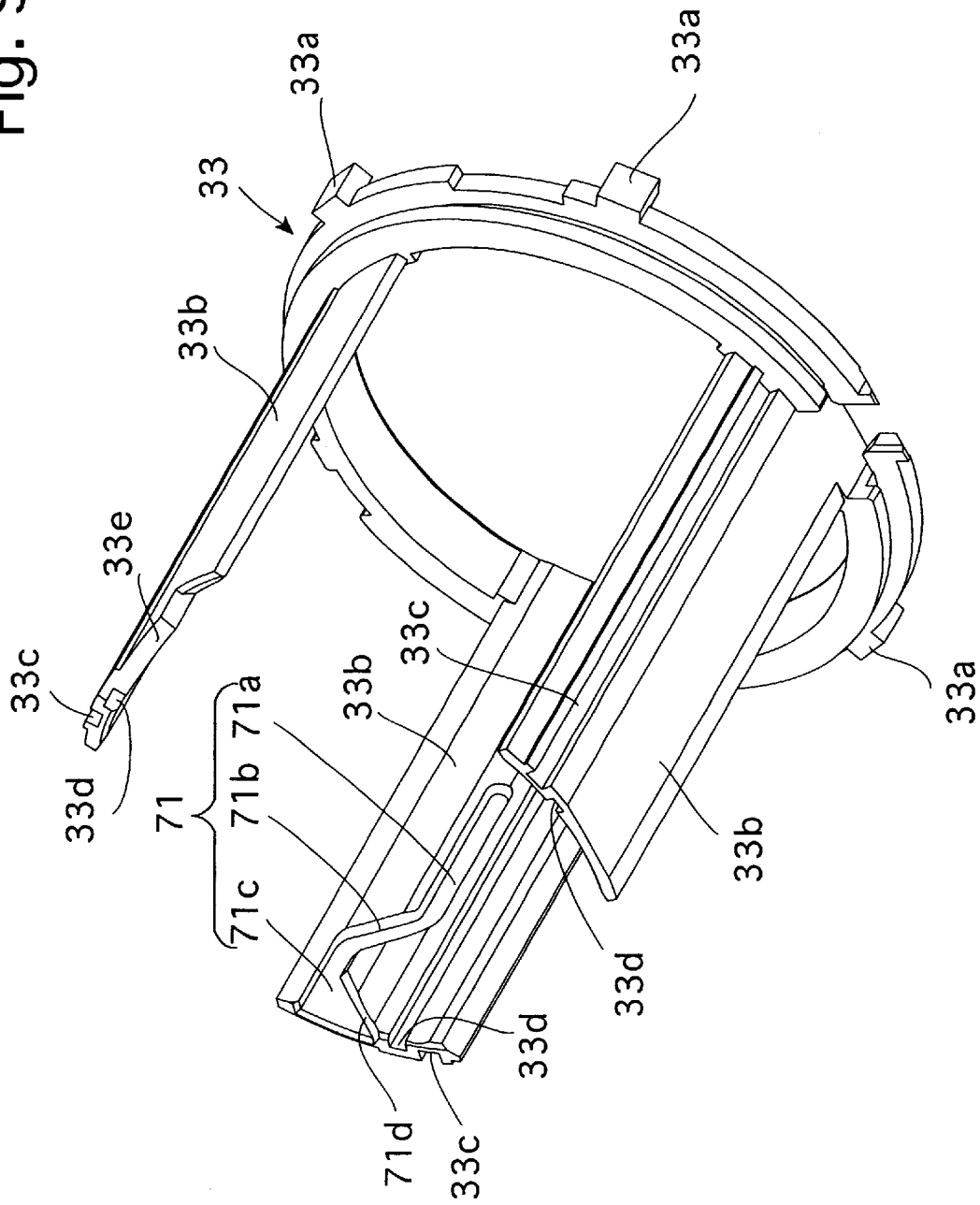
FIG. 9 is a perspective view of a third linear guide ring.
Figure 10:
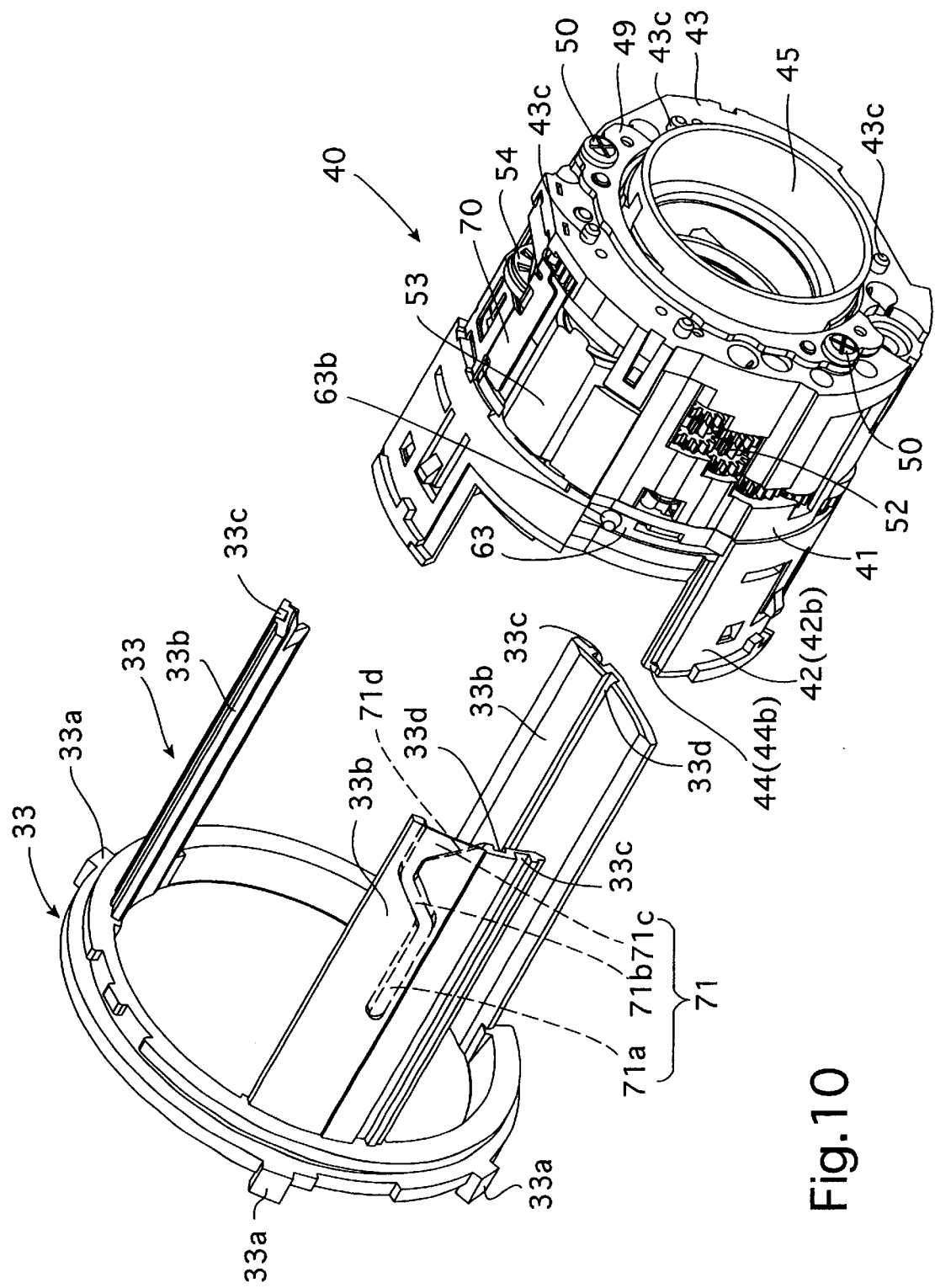
FIG. 10 is an exploded perspective view of a third linear guide ring and a lens-shutter unit.

A lens support barrel (fourth outer barrel) 31 having a first variable power lens group L1 (first sub-lens group S1 and a second sub-lens group S2) and a second lens group frame 32 having a second variable power lens group L2 secured thereto are arranged in the cam ring 30. The lens support barrel 31 and the second lens group frame 32 are guided to linearly move in the optical axis direction with the third linear guide ring 33. Specifically, as shown in FIGS. 9 and 10, three arms 33b, which are provided on the periphery of an imaginary cylinder and constitute the third linear guide ring 33, are each provided on the outer and inner surfaces (front and rear sides) thereof with linear guide grooves 33c and 33d which extend parallel with the optical axis O. Linear guide projections (not shown) provided on the inner peripheral surface of the lens support barrel 31 are movably fitted in the respective linear guide grooves 33c, and linear guide projections 32a provided on the outer peripheral surface of the second lens group frame 32 are movably fitted in the respective linear guide grooves 33d.

Figure 12:
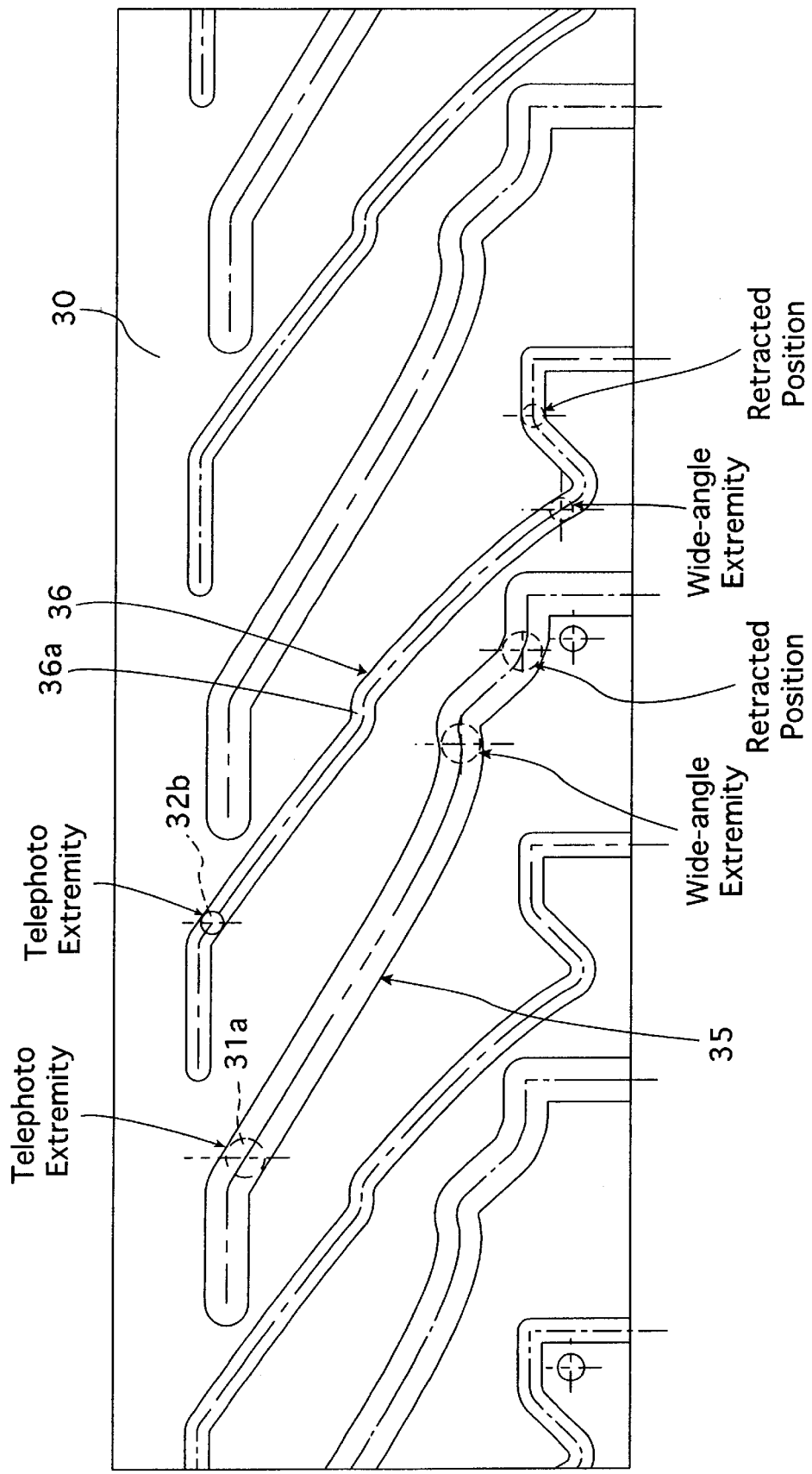
FIG. 12 is a developed view of an inner surface of a cam ring, showing a cam groove profile, by way of example.

The cam ring 30 is provided on the inner peripheral surface thereof with bottomed cam grooves 35 and bottomed cam grooves 36 for the lens support barrel 31 and the second lens group frame 32, respectively. FIG. 12 shows a developed view of the bottomed cam grooves 35 and 36. There are three sets of bottomed cam grooves 35 and 36, respectively, and are spaced in the circumferential direction at equal pitches. The lens support barrel 31 and the second lens group frame 32 are provided with radially extending cam follower projections 31a and 32b which are fitted in the bottomed cam grooves 35 and 36, respectively.

In FIG. 12, the bottomed cam grooves 35 and 36 have a range of usage between a telephoto extremity position and a retracted position. Upon photographing, the follower projections 31a and 32b are guided between the telephoto extremity position and a wide-angle extremity position within the range of usage of the bottomed cam grooves 35 and 36. The bottomed cam grooves 36 are each provided with an intermediate interruption portion 36a between the telephoto extremity and the wide-angle extremity. The first variable power lens group L1 held in the lens support barrel 31 which is guided by the bottomed cam grooves 35 has a switching function to move the first sub-lens group S1 and the second sub-lens group S2 to a mutually close position and a mutually distant position at an intermediate position between the telephoto extremity and the wide-angle extremity. Upon switching of the first variable power lens group L1, the second variable power lens group L2 passes through the intermediate interruption portions 36a of the bottomed cam grooves 36. The intermediate interruption portions 36a are not used as zooming areas during an actual zooming operation (i.e., the cam ring 30 is not stopped thereat).

In the zoom lens barrel constructed as above, when the pinion 16 is rotated in the forward or reverse direction by the zooming motor 15, the cam ring 30 is moved in the optical axis direction while rotating, so that the lens support barrel 31 (first variable power lens group L1) and the second lens group frame 32 (second variable power lens group L2), guided in the cam ring 30 to linearly move in the optical axis direction, are linearly moved in the optical axis direction in accordance with predetermined profiles of the bottomed cam grooves 35 and 36. For instance, in the retracted position of the lens barrel (accommodated position) shown in FIG. 2, the entire zoom lens barrel is substantially retracted in the camera body. When the zooming motor 15 is driven in the barrel advancing direction, the zoom lens barrel is moved to the wide-angle extremity position shown in FIG. 3. The zoom lens barrel can be moved to the telephoto extremity position shown in FIG. 4 by further rotation of the zooming motor 15 in the barrel advancing direction. If the zooming motor 15 is rotated in the reverse direction, the zoom lens barrel is moved from the telephoto extremity position to the wide-angle extremity position and to the retracted position. The zooming operation is, in practice, controlled stepwise so that the focal length from the wide-angle extremity and the telephoto extremity is split into a plurality of focal length steps, wherein the zooming motor 15 is stopped at each focal length step to carry out focusing or an exposure. In the control therefor, the area corresponding to the switching of the first sub-lens group S1 and the second sub-lens group S2 between the mutually close position to the mutually distant position is not used for photographing and, hence, the focal length step does not exist in this area, wherein the cam ring 30 (zooming motor 15) does not stop thereat.

Figure 13:
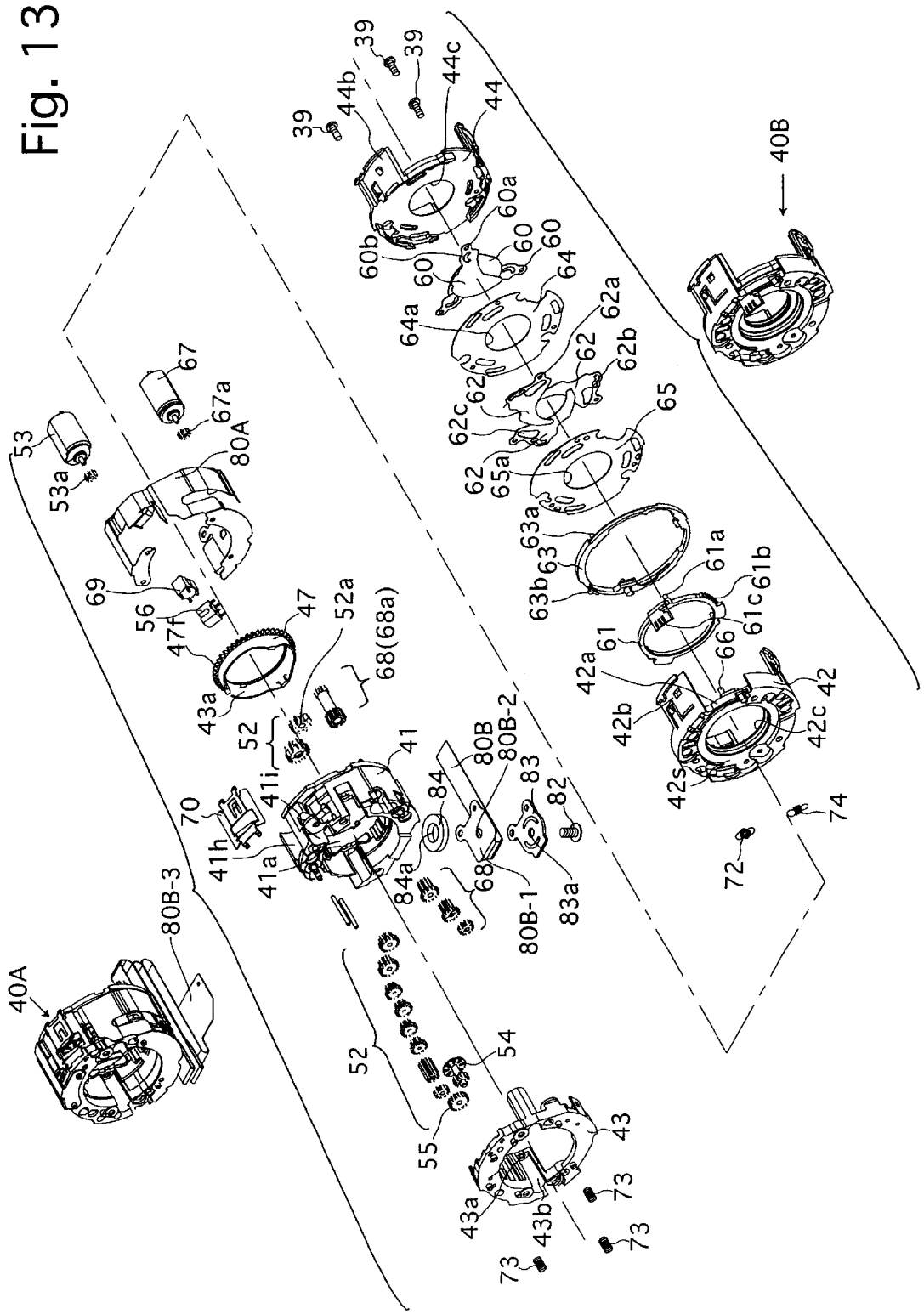
FIG. 13 is an exploded perspective view of a lens-shutter unit.
Figure 18:
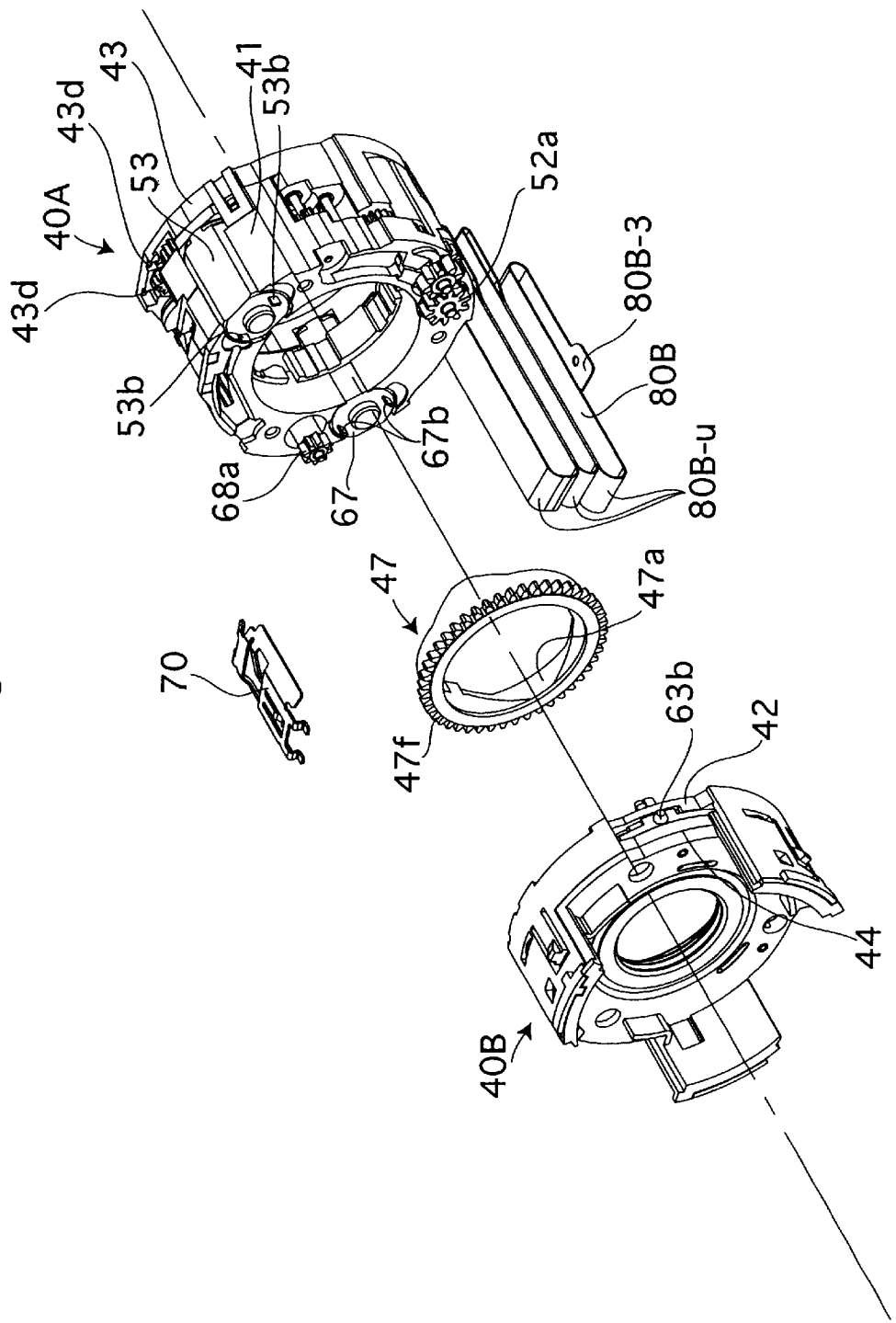
FIG. 18 is an exploded rear perspective view of a front unit and a rear unit, of a lens-shutter unit.
Figure 19:
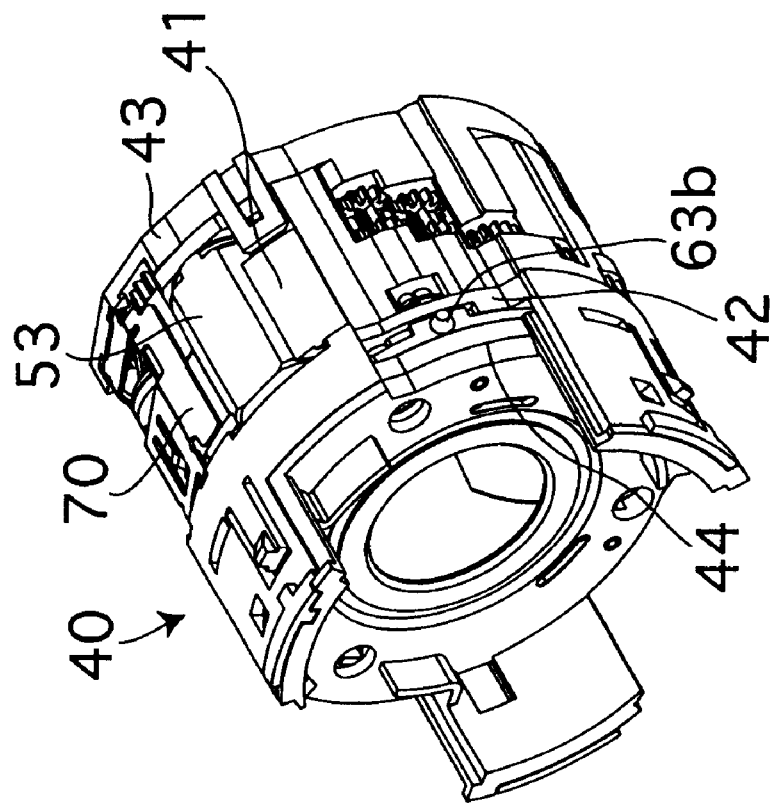
FIG. 19 is a rear perspective view of an assembly of a front and rear unit, of a lens-shutter unit.

A lens-shutter unit 40 is provided in the lens support barrel 31. As shown in FIGS. 13 and 18, the lens-shutter unit 40 includes a front support ring 41, a rear support ring 42, a gear retainer ring 43 and a sector retainer ring 44. The lens-shutter unit 40 can be split into two units, i.e., a front unit 40A having an assembly including the front support ring 41 and the gear retainer ring 43, and a rear unit 40B having an assembly including the rear support ring 42 and the sector retainer ring 44.

The front unit 40A will be discussed below. The front support ring 41 has a center opening 41a in which the front sub-lens group frame 45 and the rear sub-lens group frame 46 are fitted. The first sub-lens group S1 is secured to the front sub-lens group frame 45 and the second sub-lens group S2 is secured to the rear sub-lens group frame 46. The relative axial position of the front sub-lens group frame 45 and the rear sub-lens group frame 46 (the first sub-lens group S1 and the second sub-lens group S2) between the telephoto extremity and the wide-angle extremity can be selectively moved to the mutually distant position for a short focal length and the mutually close position for a long focal length. The relative movement of the axial position of the front sub-lens group frame 45 and the rear sub-lens group frame 46, and the focusing operation in which the front sub-lens group frame 45 and the rear sub-lens group frame 46 are moved together in the optical axis direction, can be performed by the drive ring 47.

The rearward extremity of the drive ring 47 is restricted by the receiving surface 42s of the rear support ring 42 and is rotatably supported between the front support ring 41 and the rear support ring 42.

Figure 20:
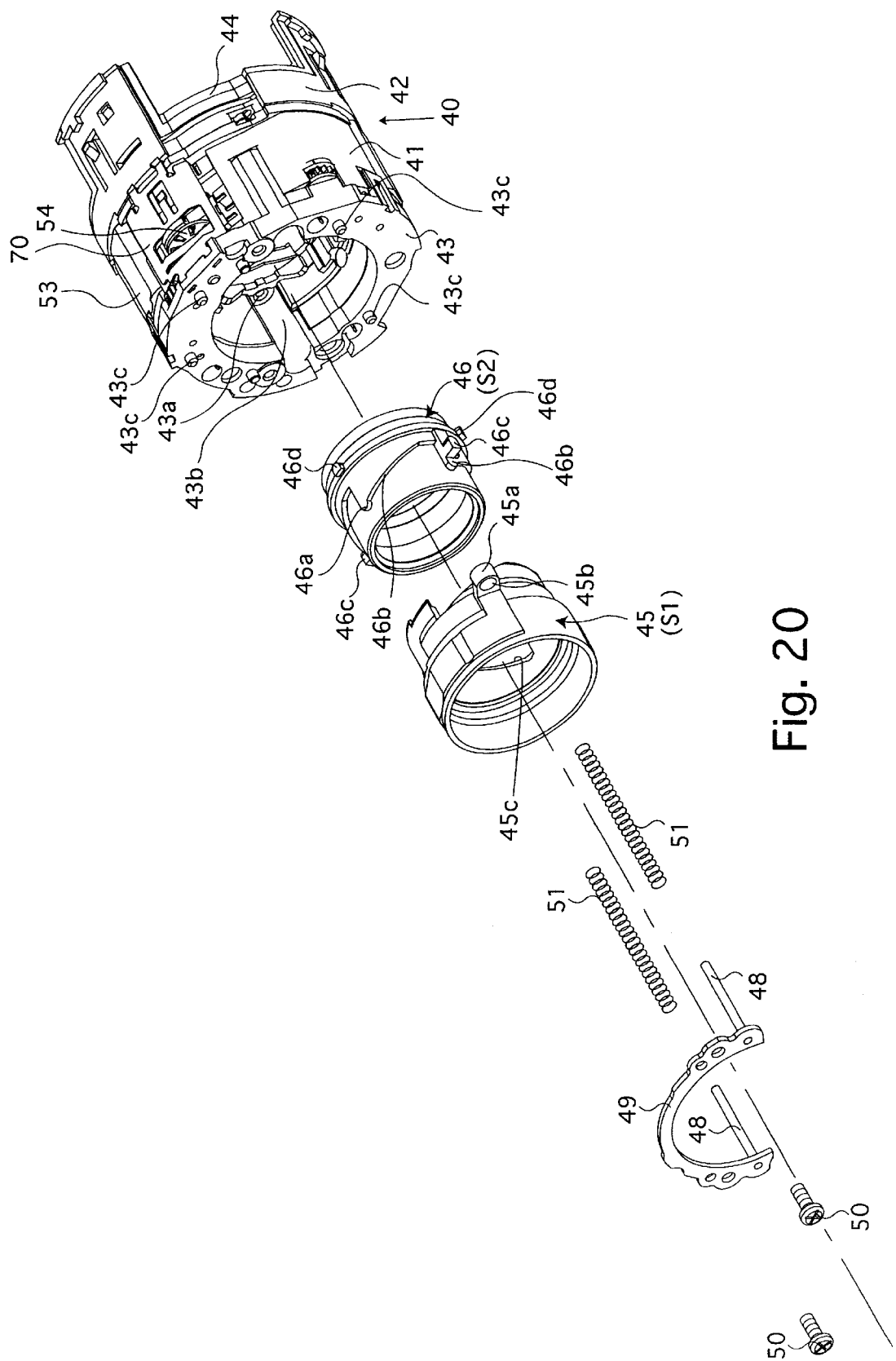
FIG. 20 is an exploded perspective view of a first variable power lens group and surrounding components thereof.

The front sub-lens group frame 45 is cylindrical and is provided on the outer periphery thereof with diametrically opposed linear guide ribs 45a, as shown in FIG. 20. The linear guide ribs 45a are provided with guide holes 45b in which linear guide rods 48 are loosely fitted (inserted). The linear guide rods 48 are secured at the rear ends thereof to securing holes 43a formed in the bottom of the gear retainer ring 43, and the front ends of the linear guide rods 48 are secured to a securing bracket 49. The securing bracket 49 is secured to the front surface of the gear retainer ring 43 with securing screws 50. Compression coil springs 51 which are provided between the securing bracket 49 and the linear guide ribs 45a surround the linear guide rods 48 to bias the front sub-lens group frame 45 toward the rear sub-lens group frame 46. The gear retainer ring 43 is provided with generally U-shaped recesses 43b in which the linear guide rods 48 and the compression coil springs 51 are received. The recesses 43b are communicatively connected to the center opening 41a of the front support ring 41.

Figure 22:
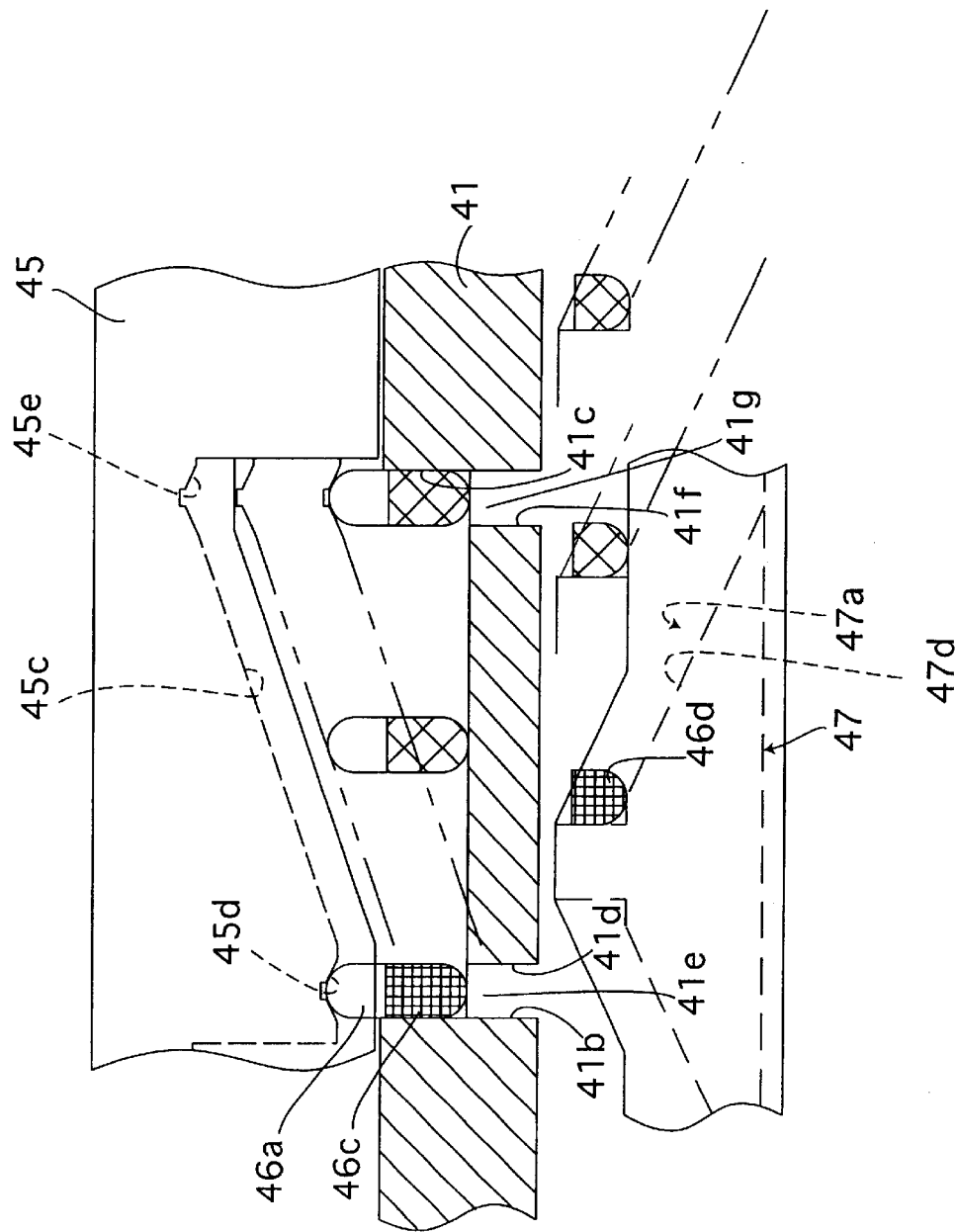
FIG. 22 is an enlarged developed view of a front sub-lens group frame, a rear sub-lens group frame and a drive ring, in connection with a front hold ring.

The front sub-lens group frame 45 has four shift leading surfaces (shift cam surfaces) 45c, which are formed circumferentially at equi-angular intervals on the end-face of the front sub-lens group frame 45, in order to move the front and rear sub-lens group frames to a mutually close position or a mutually distant position, in the optical axis direction. The shift leading surfaces 45c are provided at their opposed ends with follower engaging recesses 45d and 45e (FIG. 22). Note that only one shift leading surface 45c is shown in FIG. 22. The rear sub-lens group frame 46 is provided with four follower projections 46a corresponding to the shift leading surfaces 45c of the front sub-lens group frame 45. As shown in FIG. 20, the follower projections 46a are provided on the front end portions of inclined surfaces 46b, corresponding to the shift leading surfaces 45c of the front sub-lens group frame 45. The shift leading surfaces 45c formed on the front sub-lens group frame 45 and the follower projections 46a formed on the rear sub-lens group frame 46 constitute a shift cam mechanism for moving the front sub-lens group frame 45 and the rear sub-lens group frame 46 to a mutually close position or to a mutually distant position, in the optical axis direction.

The rear sub-lens group frame 46 is also provided with a pair of linear guide projections 46c which are located at the same circumferential positions as two of the four follower projections 46a that are diametrically opposed, and are provided behind the two follower projections 46a in the axial direction. Furthermore, three driven projections 46d are provided on the outer peripheral surface of the rear sub-lens group frame 46 and are spaced at equi-angular intervals in the circumferential direction and behind the linear guide projections 46c in the axial direction.

The front support ring 41 is provided on the inner peripheral surface thereof with a pair of rotation preventing surfaces 41b and 41c (see FIG. 22) which correspond to the linear guide projections 46c of the rear sub-lens group frame 46 and restrict the angular displacement of the rear sub-lens group frame 46 with respect to the front support ring 41, which does no rotate. Namely, the rotation preventing surfaces 41b and 41c engage with the linear guide projections 46c to prevent further rotation of the rear sub-lens group frame 46 at the rotational movement extremities thereof when the rear sub-lens group frame 46 is rotated in the forward and reverse directions. Moreover, the rotation preventing surface 41b and the guide surface 41d opposed thereto constitute a wide-angle linear guide groove 41e, and the rotation preventing surface 41c and the guide surface 41f opposed thereto constitute a telephoto linear guide groove 41g. The linear guide projections 46c are substantially snugly engaged in the guide grooves 41e and 41g at the wide-angle and telephoto extremities, respectively.

Figure 23:
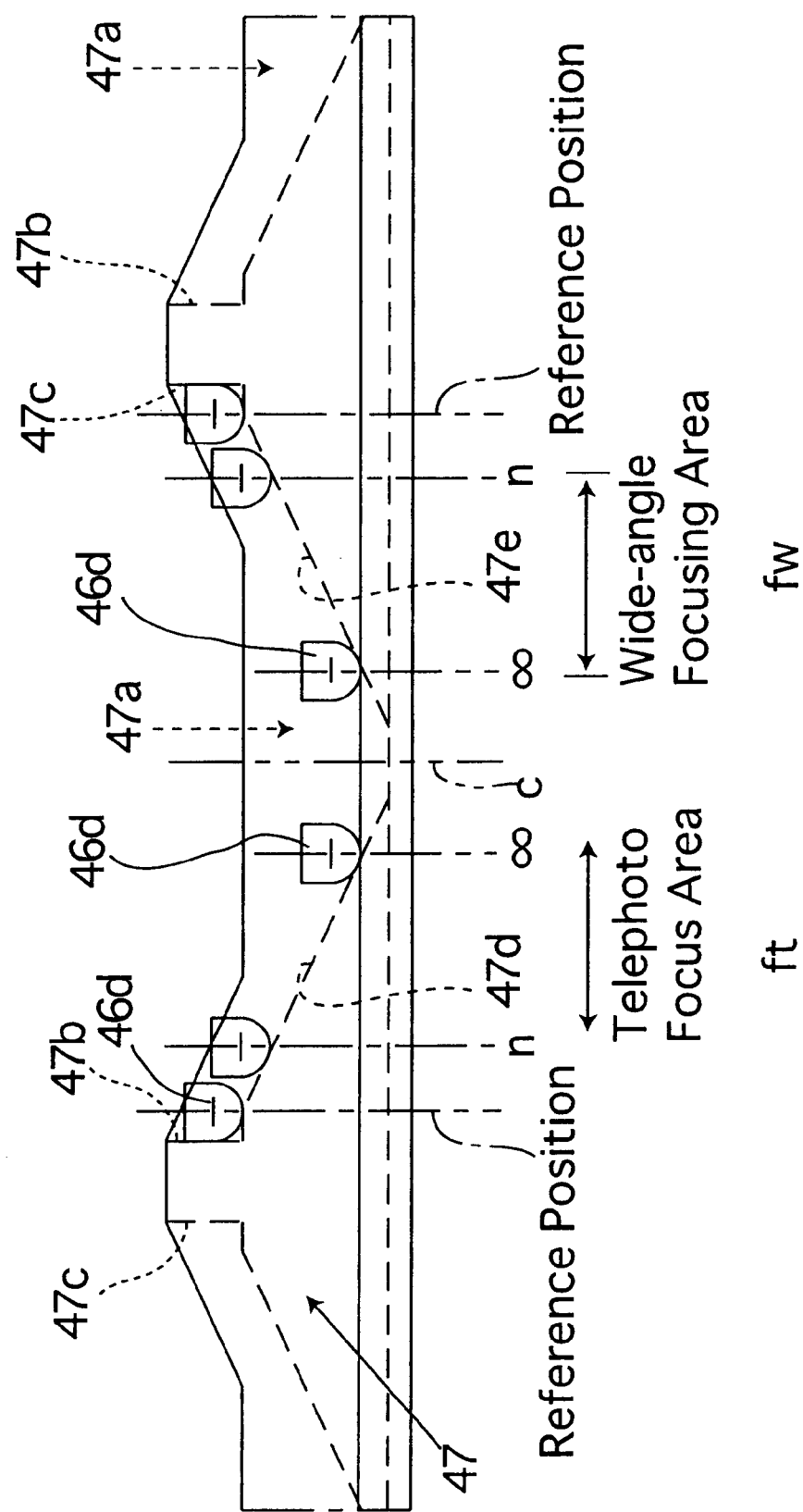
FIG. 23 is an explanatory view showing a focusing operation using a drive ring.

The drive ring 47 has three control recesses 47a (FIGS. 18 and 22) at the front end surface thereof, corresponding to the three driven projections 46d of the rear sub-lens group frame 46. Note that only one or two control recesses 47a are shown in the drawings. As shown in FIG. 23, the control recesses 47a are symmetrical in the lateral direction with respect to a center line 'c' parallel with the optical axis, and each include a pair of effective surfaces 47b and 47c which engage with the driven projection 46d, and telephoto and wide-angle focus leading surfaces (focus cam surfaces) 47d and 47e which abut against the arc end-surface of the driven projection 46d. The telephoto focus leading surface 47d and the wide-angle focus leading surface 47e are defined by end cam surfaces having open ends between the effective surfaces 47b and 47c. The focus leading surfaces 47d and 47e are inclined with respect to the circumferential direction in opposite directions and at an equal inclination angle. The focus leading surfaces 47d and 47e of the drive ring 47 and the driven projections 46d formed on the rear sub-lens group frame 46 constitute a focus cam mechanism.

Figure 24:
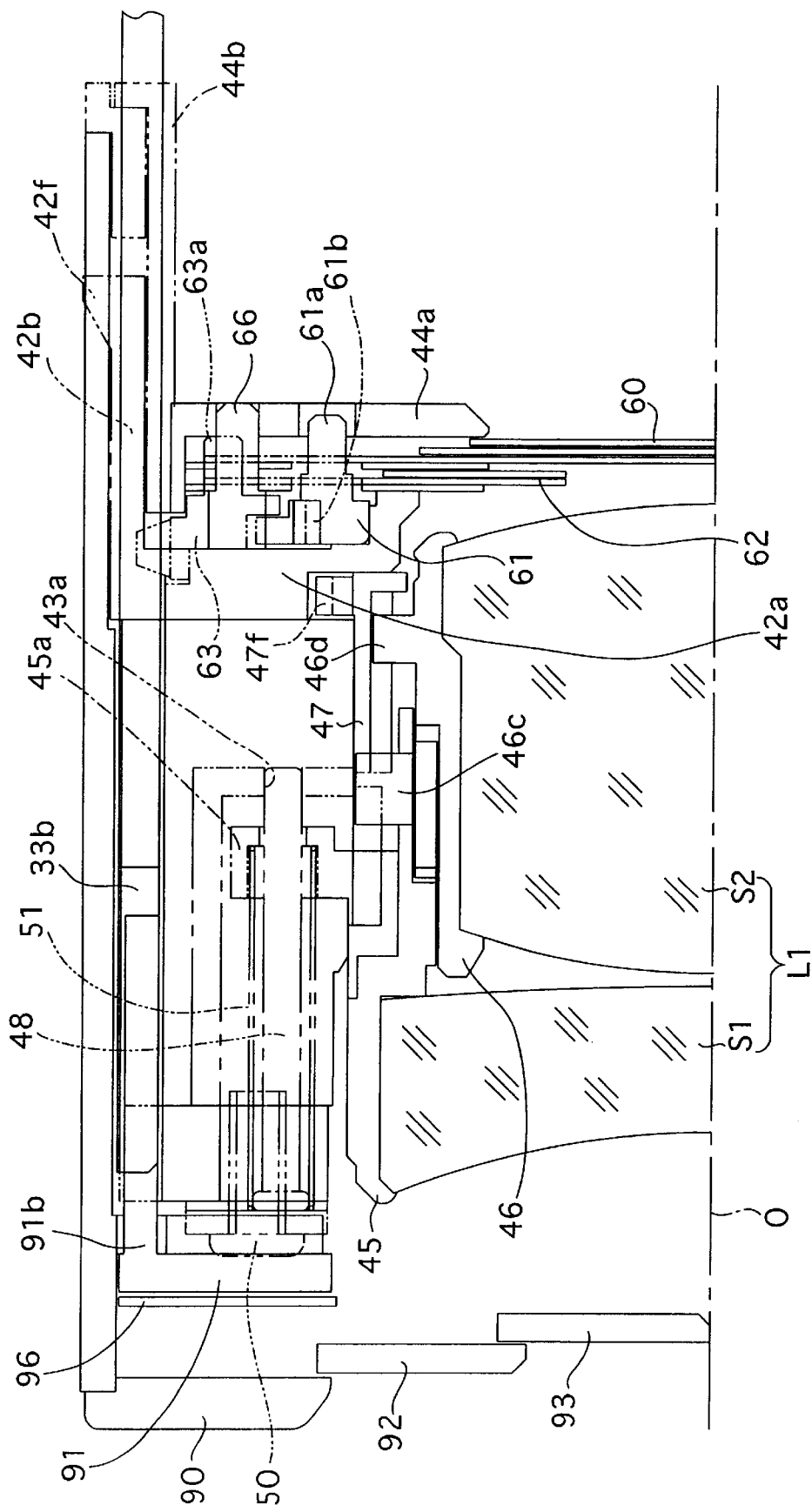
FIG. 24 is an enlarged sectional view of an upper half of a lens-shutter unit and the surrounding components thereof when a lens barrier thereof is closed.
Figure 25:
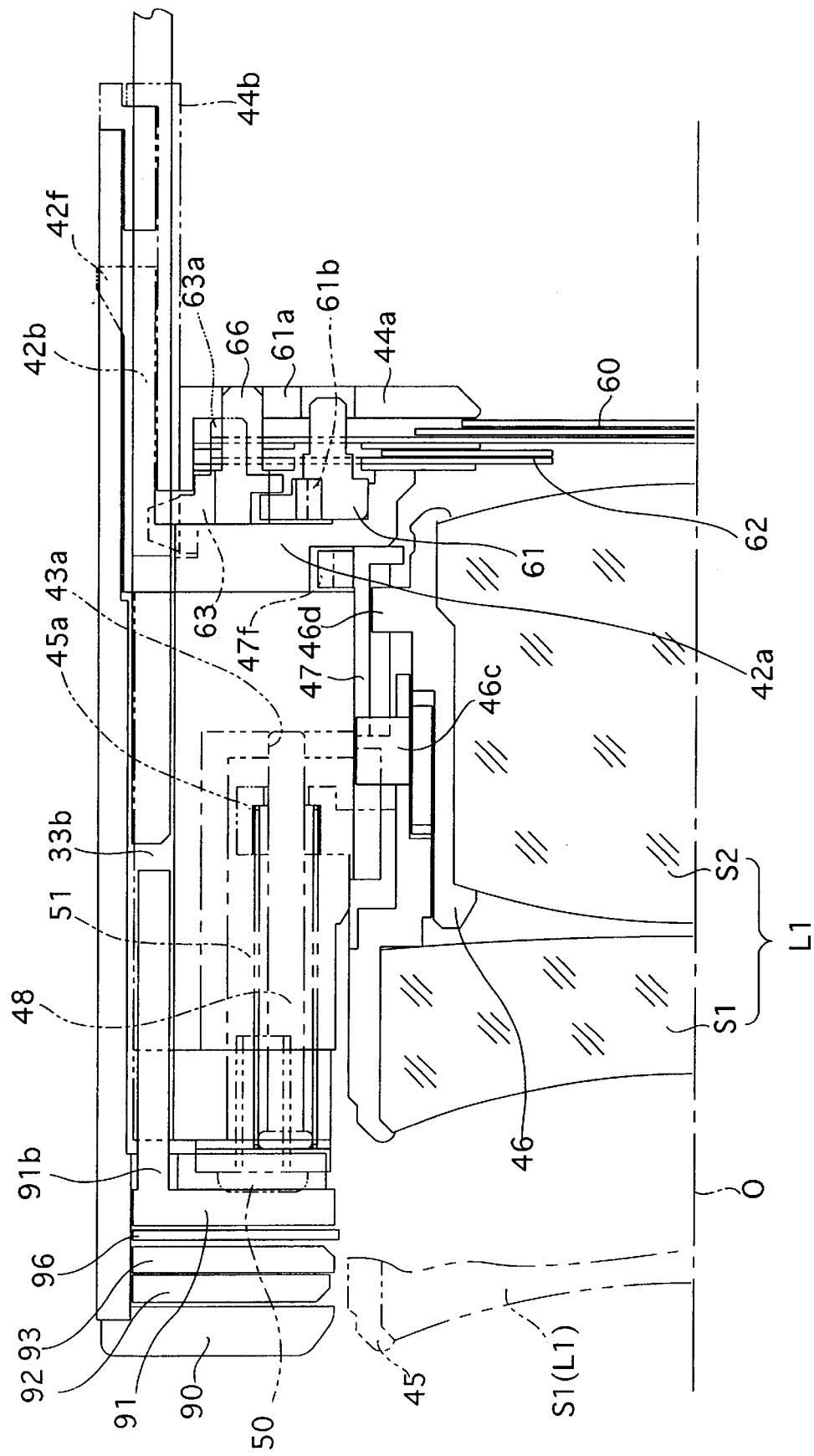
FIG. 25 is a sectional view similar to FIG. 24, when a lens barrier is open.

The compression coil springs 51, which bias the front sub-lens group frame 45 rearwardly, cause the shift leading surfaces 45c of the front sub-lens group frame 45 to be always in contact with the follower projections 46a of the rear sub-lens group frame 46, and cause the driven projections 46d of the rear sub-lens group frame 46 to be always in contact with the telephoto or wide-angle focus leading surfaces 47d and 47e. The drive ring 47 abuts at the rear end surface thereof against the receiving surface 42s of the rear support ring 42, as mentioned above. The contact relationship of the front sub-lens group frame 45, the rear sub-lens group frame 46, the drive ring 47, and the rear support ring 42 (receiving surface 42s) is maintained by the spring force of the compression coil springs 51. In contacting state, as shown in FIGS. 24 and 25, the front end of the rear sub-lens group frame 46 is inserted inside the inner peripheral surface of the front sub-lens group frame 45, and the drive ring 47 is fitted on the outer peripheral surface of the rear sub-lens group frame 46.

At the mutually distant position at the wide-angle side of the first sub-lens group S1 and the second sub-lens group S2, the effective surfaces 47b of the drive ring 47 abut against the driven projections 46d, and the linear guide projections 46c are disengaged from the wide-angle linear guide grooves 41e. In this state, if the drive ring 47 is moved in the right hand direction with respect to FIG. 22 (rotated in the clockwise direction), the effective surfaces 47b press against the driven projections 46d and rotate the rear sub-lens group frame 46 in the same direction, so that the linear guide projections 46c abut against the rotation preventing surfaces 41c. During this movement, the front sub-lens group frame 45 (first sub-lens group S1) comes close to the rear sub-lens group frame 46 (second sub-lens group S2) in accordance with the engagement of the shift leading surfaces 45c and the follower projections 46a of the rear sub-lens group frame 46 and, consequently, the follower projections 46a are stably engaged in the follower engaging recesses 45e.

Thus, the switching from the mutually distant position at the wide-angle side to the mutually close position at the telephoto side is completed. Consequently, the first sub-lens group S1 is close to the second sub-lens group S2 (mutually close extremity, i.e., at a mutually close position for a long focal length), and no further rotation of the drive ring 47 in the same direction is permitted.

When the switching to the mutually close position at the telephoto side is completed, the drive ring 47 is rotated in the reverse direction. Consequently, the driven projections 46d (rear sub-lens group frame 46) are moved rearwardly in accordance with the telephoto focus leading surfaces 47d and, hence, the linear guide projections 46c are engaged in the telephoto linear guide grooves 41g, so that the linear guide projections 46c are linearly movable only in the axial direction. The focusing operation on the telephoto side, from an intermediate focal length to the long focal length extremity (telephoto extremity), is carried out by the integral movement of the rear sub-lens group frame 46 and the front sub-lens group frame 45 at the mutually close extremity via the telephoto focus leading surfaces 47d. Namely, as shown in FIG. 23, when the drive ring 47 is rotated within the telephoto focus area ft (from the infinite object distance ∞ to the shortest object distance n) in a state that the driven projections 46d of the rear sub-lens group frame 46 abut against the telephoto focus leading surfaces 47d, the rear sub-lens group frame 46 whose rotation is restricted by the engagement of the telephoto linear guide grooves 41g, the linear guide projections 46c, and the front sub-lens group frame 45 whose rotation is restricted by the engagement of the linear guide rods 48 in the guide holes 45b (i.e., the first sub-lens group S1 and the second sub-lens group S2) are integrally moved together in the optical axis direction to carry out the focusing operation.

When the drive ring 47 is rotated until the effective surfaces 47c come into contact with the driven projections 46d, the linear guide projections 46c of the rear sub-lens group frame 46 are disengaged from the telephoto linear guide grooves 41g. In this state, when the drive ring 47 is moved in the left hand direction in FIG. 22 (rotated in the counterclockwise direction), the effective surfaces 47c press against the driven projections 46d to thereby rotate the rear sub-lens group frame 46 in the same direction. Consequently, the linear guide projections 46c abut against the rotation preventing surfaces 41b. During this movement, the front sub-lens group frame 45 comes close to the rear sub-lens group frame 46 in accordance with the engagement of the shift leading surfaces 45c and the follower projections 46a of the rear sub-lens group frame 46, and the follower projections 46a become stably engaged in the follower engaging recesses 45d. Thus, the switching from the mutually close position at the telephoto side to the mutually distant position at the wide-angle side is completed, so that the first sub-lens group S1 moves away from the second sub-lens group S2 (mutually distant extremity, i.e., the mutually distant position for a long focal length), and no further rotation of the drive ring 47 in the same direction is permitted.

When the switching to the mutually distant position at the wide-angle side is completed, the drive ring 47 is rotated in the reverse direction. Consequently, the driven projections 46d (rear sub-lens group frame 46) are moved rearwardly in accordance with the wide-angle linear guide grooves 41e, and accordingly, the linear guide projections 46c are engaged in the wide-angle linear guide grooves 41e and is linearly movable only in the optical axis direction. The focusing operation on the wide-angle side, from an intermediate focal length to the short focal length extremity, is carried out by the integral movement of the rear sub-lens group frame 46 and the front sub-lens group frame 45 at the mutually distant extremity by the wide-angle linear guide grooves 41e. Namely, as shown in FIG. 23, when the drive ring 47 is rotated within the wide-angle focus area fw (from the infinite object distance ∞ to the shortest object distance n) in a state that the driven projections 46d abut against the wide-angle focus leading surface 47e, the rear sub-lens group frame 46 whose rotation is restricted by the engagement of the wide-angle linear guide grooves 41e and the linear guide projections 46c, and the front sub-lens group frame 45 whose rotation is restricted by the engagement of the linear guide rods 48 in the guide holes 45b (i.e., the first sub-lens group S1 and the second sub-lens group S2) are moved together in the optical axis direction to carry out the focusing operation.

When the drive ring 47 is rotated until the effective surfaces 47b abut against the driven projections 46d, the linear guide projections 46c of the rear sub-lens group frame 46 are disengaged from the wide-angle linear guide grooves 41e and are returned to the initial state.

As mentioned above, in the front unit 40A of the lens-shutter unit 40, the shifting operation for moving the first sub-lens group S1 and the second sub-lens group S2 to the mutually distant position for a short focal length, or to the mutually close position for a long focal length, and the focusing operation in which the first variable power lens group L1 is entirely moved in the optical axis direction, can be carried out by controlling the rotation of the drive ring 47. The focusing operations on the telephoto side and the wide-angle side are carried out by controlling the number of pulses counted by a pulser (encoder) of the driving system which drives the drive ring 47, with reference to the position (the position in which the direction of the rotation of the drive ring 47 is reversed) in which the linear guide projections 46c of the rear sub-lens group frame 46 abut against the rotation preventing surfaces 41b or 41c. For instance, the number of the pulses to move the focusing lens group (i.e., the first variable power lens group L1 including the first sub-lens group S1 and the second sub-lens group S2) to the shortest object distance n, the infinite object distance ∞, or an object distance therebetween, from the reference position can be predetermined taking into account the lead angles of the telephoto and wide-angle focus leading surfaces 47d and 47e. Therefore, focusing can be carried out based on the object distance data by controlling the number of pulses.

The drive ring 47 is provided, on the entire outer peripheral surface of the rear end thereof, with a gear 47f which is in mesh with a terminal gear 52a (FIG. 18) of a reduction gear train 52, so that the gear 47f can be rotated in the forward or reverse direction by a reversible drive motor 53 rotating in the forward and reverse directions (see FIGS. 13 and 18).

A pinion 53a of the reversible drive motor 53 is located on the front side of the front support ring 41 and a gear 47f of the drive ring 47 is located between the front support ring 41 and the rear support ring 42, i.e., on the rear side of the front support ring 41. Consequently, the reduction gear train 52, shown in FIG. 13, which transmits the motor drive force from the pinion 53a to the gear 47f, is held between the front support ring 41 and the gear retainer ring 43 in such a way that the gears are arranged along the outer peripheral surface of the front support ring 41. Moreover, a rotating slit disc 54, which constitutes the pulser to detect the amount of rotation of the reversible drive motor 53, is provided in the vicinity of the pinion 53a of the reversible drive motor 53. A relay gear 55 is provided between the rotating slit disc 54 and the pinion 53a.

The reversible drive motor 53 is held in a motor holding recess 41h of the front support ring 41. The rotating slit disc 54 is held in the slit disc holding recess 41i of the front support ring 41 (shown best in FIG. 17). The front support ring 41 is provided with an interrupter holding recess 41j communicatively connected to the slit disc holding recess 41i. A photo-interrupter 56 for detecting a drive amount of the reversible drive motor 53 for the switching operation of the sub-lens groups and for the focusing operation, is received in the interrupter holding recess 41j (see FIG. 17). The rotating slit disc 54 is arranged in the photo-interrupter 56 (between two components of the photo-interrupter), so that the rotation angle (amount of angular displacement) of the slit disc 54 can be detected by counting the number of pulses. In other words, the drive amount of the reversible drive motor 53 can be detected.

Figure 14:
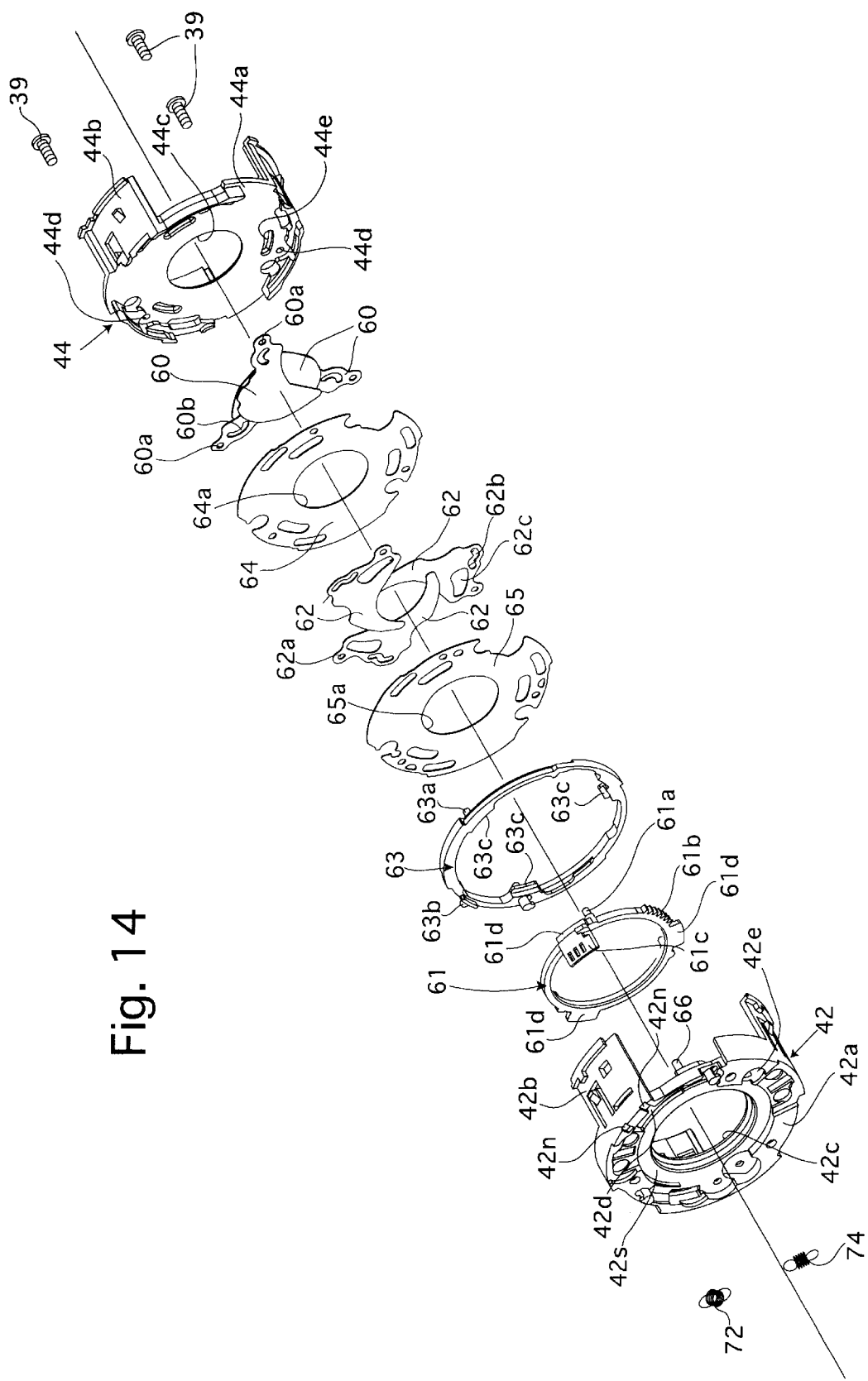
FIG. 14 is an exploded perspective view of a rear unit of a lens-shutter unit.
Figure 15:
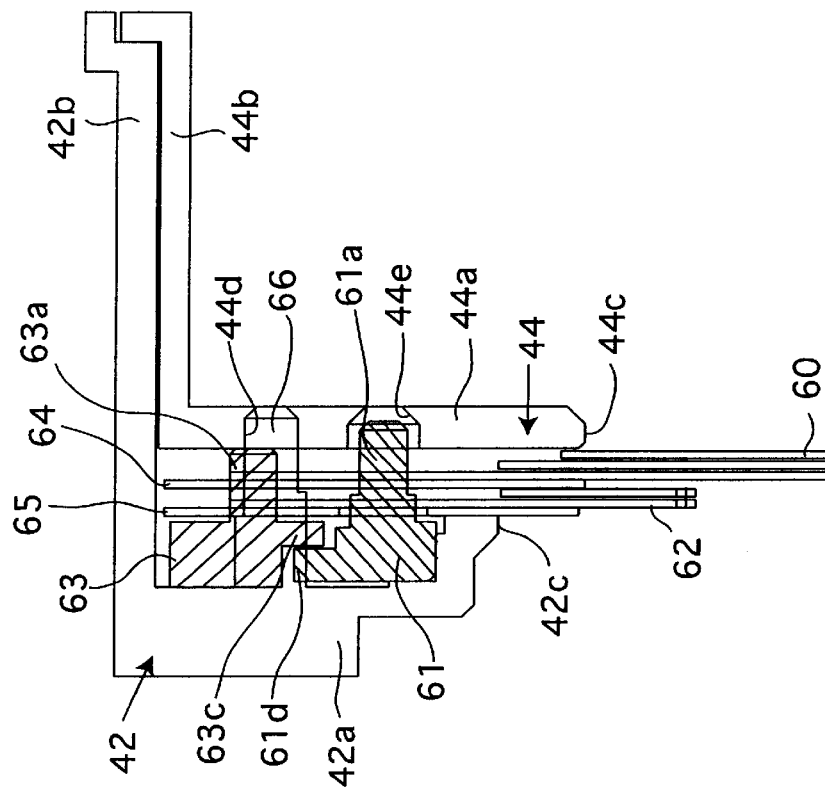
FIG. 15 is a sectional view of an upper half of a rear unit of a lens-shutter unit.

The rear unit 40B will be explained below. A lens shutter and a diaphragm mechanism are provided between the rear support ring 42 and the sector retainer ring 44. As shown in FIGS. 13 and 14, the rear support ring 42 and the sector retainer ring 44 are provided with front wall portions 42a and 44a in the form of circular discs extending in orthogonal planes, with respect to the optical axis, and three rear arms 42b and 44b extending rearwardly in the optical axis direction from the front wall portions 42a and 44a, respectively. The lens shutter and the diaphragm mechanism are held between the front wall portions 42a and 44a. The rear arms 42b and 44b are overlapped in the radial direction of the lens barrel (see FIG. 15).

The lens shutter has three shutter sectors 60 and a shutter drive ring 61 which opens and closes the shutter sectors 60. The diaphragm mechanism has three diaphragm sectors 62 and a diaphragm drive ring 63 which opens and closes the diaphragm sectors 62. A separation plate 64 is arranged between the shutter sectors 60 and the diaphragm sectors 62, and a separation plate 65 is arranged between the diaphragm sectors 62 and the diaphragm drive ring 63. The separation plate 64 prevents interference between the movable shutter sectors 60 and the movable diaphragm sectors 62, and the separation plate 65 prevents interference of the diaphragm sectors 62 with the rotatable shutter drive ring 61 and the rotatable diaphragm drive ring 63. The sector retainer ring 44, the separation plate 64 and the separation plate 65 are provided with photographing circular openings 44c, 64a and 65a, respectively, which have substantially in the same diameter about the optical axis O. The rear support ring 42 is provided with a center opening 42c whose diameter is greater than the diameter of the photographing circular openings 44c, 64a and 65a.

The shutter sectors 60 and diaphragm sectors 62 which are each made of three blades are rotatably supported by projecting pivots (support pivots) 66 (only one of which is shown in FIGS. 13 and 14) which extend rearward from the front wall portion 42a of the rear support ring 42. The projecting pivots 66 extend through support holes 60a and 62a formed in the shutter sectors 60 and the diaphragm sectors 62. Projecting pivot securing holes 44d (see FIG. 14), in which the front ends of the projecting pivots 66 are received, are formed in the front wall portions 44a of the sector retainer ring 44.

The shutter drive ring 61 is provided with three rotation transmission dowels 61a which are engaged in rotational guide cam slots 60b formed in the shutter sectors 60. The three shutter sectors 60 are rotated about the projecting pivots 66 in accordance with the relationship between the rotational guide cam slots 60b and the rotation transmission dowels 61a when the shutter drive ring 61 is reciprocally rotated, so that the front portion of the photographing circular opening 44c is opened and closed. The aperture of the shutter sectors 60 can be controlled by the angular displacement of the shutter drive ring 61. The sector retainer ring 44 is provided with dowel receiving slots 44e in which the front ends of the rotation transmission dowels 61a are inserted. The shutter drive ring 61 is biased in the closing direction by a shutter drive ring biasing spring 74, so that play (in the shutter drive ring 61) can be removed by the shutter drive ring biasing spring 74.

Similar to the shutter drive ring 61, the diaphragm drive ring 63 is provided with three rotation transmission dowels 63a which are engaged in rotational guide cam slots 62b formed in the diaphragm sectors 62. The three diaphragm sectors 62 are rotated about the projecting pivots 66 in accordance with the relationship between the rotational guide cam slots 62b and the rotation transmission dowels 63a when the diaphragm drive ring 63 is reciprocally rotated, so that the front portion of the photographing circular opening 44c is opened and closed. The aperture of the diaphragm sectors 62 can be controlled by the angular displacement of the diaphragm drive ring 63. The diaphragm sectors 62 are provided with through-holes 62c to prevent interference with the rotation transmission dowels 61a of the shutter drive ring 61 regardless of the angular position of the diaphragm sectors 62. The front ends of the rotation transmission dowels 63a are in contact with, and held by, the front surface of the front wall portion 44a. The diaphragm drive ring 63 is biased by a diaphragm drive ring biasing spring 72 which is engaged at one end thereof with the diaphragm drive ring 63 and at the other end thereof with the rear support ring 42 in a direction to open the diaphragm sectors 62.

In the zoom lens barrel of the present invention, the shutter sectors 60 have a variable diaphragm function to determine a desired aperture value and a shutter function, and are electrically controlled so that the amount of opening (aperture value) and the opening time (shutter speed) of the shutter sectors 60 are varied in accordance with the exposure value when the shutter is released. The diaphragm sectors 62 are provided to restrict the maximum value of the aperture at a wide-angle object distance in particular, and the amount of opening thereof is varied in accordance with the feed amount of the zoom lens barrel as a whole.

The shutter drive ring 61 for opening and closing the shutter sectors 60 is provided on the outer peripheral surface thereof with a partial sector gear 61b which is in mesh with a reduction gear train 68 connected to a shutter drive motor 67 (see FIGS. 13 and 18). The shutter drive motor 67 is held in a motor holding recess 41k (see FIG. 17) of the front support ring 41, and a pinion 67a of the shutter drive motor 67 is located in front of the front support ring 41. The reduction gear train 68 transmits the drive force of the motor to the rear side of the front support ring 41, and has a terminal gear 68a distant from the pinion 67a of the shutter drive motor 67 exposed to the rear portion of the front support ring 41 (front unit 40A), as shown in FIG. 18. The front wall portion 42a of the rear support ring 42 is provided with a through-hole 42e in which the terminal gear 68a of the reduction gear train 68 is inserted so as to engage with the sector gear 61b.

When the shutter drive motor 67 is rotated in the forward or reverse direction, the shutter drive ring 61 is rotated in the same direction, so that the shutter sectors 60, which are in a closed position, are instantaneously opened and closed. As mentioned above, the amount of opening, and the opening time of the shutter sectors 60 are variable and are controlled in accordance with the drive signal (electric current) supplied to the shutter drive motor 67. Namely, if the rotation angle of the shutter drive ring 61 driven by the shutter drive motor 67 is increased, the amount of opening of the shutter sectors 60 is increased and the aperture value is reduced (approaches a fully open diaphragm position). If the rotation angle of the shutter drive ring 61 is decreased, the amount of opening of the shutter sectors 60 is decreased and the aperture value is increased (diaphragm closes). Moreover, if the time interval between the forward rotation and the reverse rotation of the shutter drive ring 61 driven by the shutter drive motor 67 is shortened, the opening time of the shutter sectors 60 is shortened, so that the shutter speed is increased. Conversely, if the time interval between the forward rotation and the reverse rotation is lengthened, the opening time of the shutter sectors 60 is prolonged, thus resulting in a slower shutter speed.

The shutter drive ring 61 has a slit plate 61c which is in the form of a small portion of a cylinder and protrudes forward in the optical axis direction. The slit plate 61c extends through an arc opening 42d (see FIG. 14), formed in the front wall portion 42a of the rear support ring 42, and an arc opening 41m (see FIG. 17) formed in the rear surface of the front support ring 41. The slit plate 61c is located in a photo-interrupter 69 (between two components of the photo-interrupter 69) shown in FIG. 17, so that the passing of slits of the slit plate 61c can be detected by the photo-interrupter 69 in order to detect the shutter operation. Namely, the opening and closing of the shutter sectors 60 can be detected by the operation of the shutter drive ring 61 via the slit plate 61c and the photo-interrupter 69.

The front support ring 41 is provided with an interrupter holding recess 41n (see FIG. 17) for receiving the photo-interrupter 69. The interrupter holding recess 41n is located adjacent to the interrupter holding recess 41j for receiving the photo-interrupter 56 for detecting the switching and focusing drive amount. The recesses 41n and 41j are covered by a common cover 70 in the form of a leaf spring. The two photo-interrupters 56 and 69 are held by the leaf spring cover 70.

As can be understood from the foregoing, in the zoom lens barrel of the present embodiment, the exposure is controlled by the shutter sectors 60. The purpose of the diaphragm sectors 62 is to restrict the size of the aperture so that the peripheral portion of the zoom lens system is not used for photographing at the short focal length.

Figure 11:
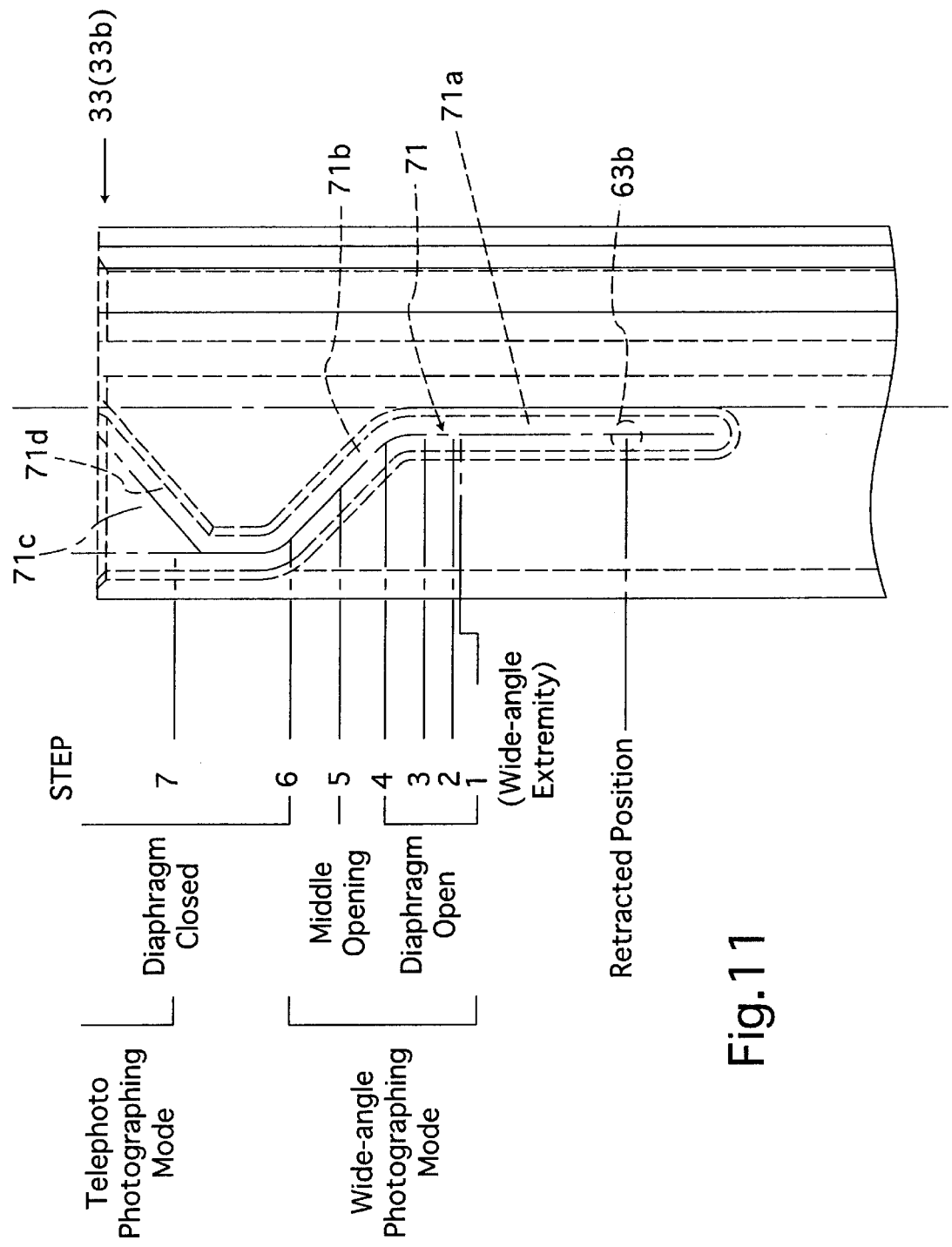
FIG. 11 is a developed view of a third linear guide ring, showing a diaphragm control cam groove thereof.

The diaphragm drive ring 63, for opening and closing the diaphragm sectors 62, is provided on the outer peripheral surface thereof with a driven projection 63b which is engaged in a diaphragm control cam groove 71 (see FIG. 10) formed in the inner peripheral surface of the arm 33b of the third linear guide ring 33. Upon zooming, the third linear guide ring 33 and the lens-shutter unit 40 (diaphragm drive ring 63) are relatively moved in the optical axis direction. Consequently, the driven projection 63b is moved in the circumferential direction in accordance with the diaphragm control cam groove 71 to rotate the diaphragm drive ring 63 to thereby vary the opening degree of the diaphragm sectors 62. As shown in FIG. 11, the diaphragm control cam groove 71 includes a linear restriction portion 71a extending parallel with the optical axis O, an oblique restriction portion 71b which is inclined with respect to the optical axis O, and a restriction releasing portion 71c which opens into the front end of the third linear guide ring 33. The width of the linear restriction portion 71a and the oblique restriction portion 71b is such that the driven projection 63b can be substantially snugly fitted therein.

Figure 2:
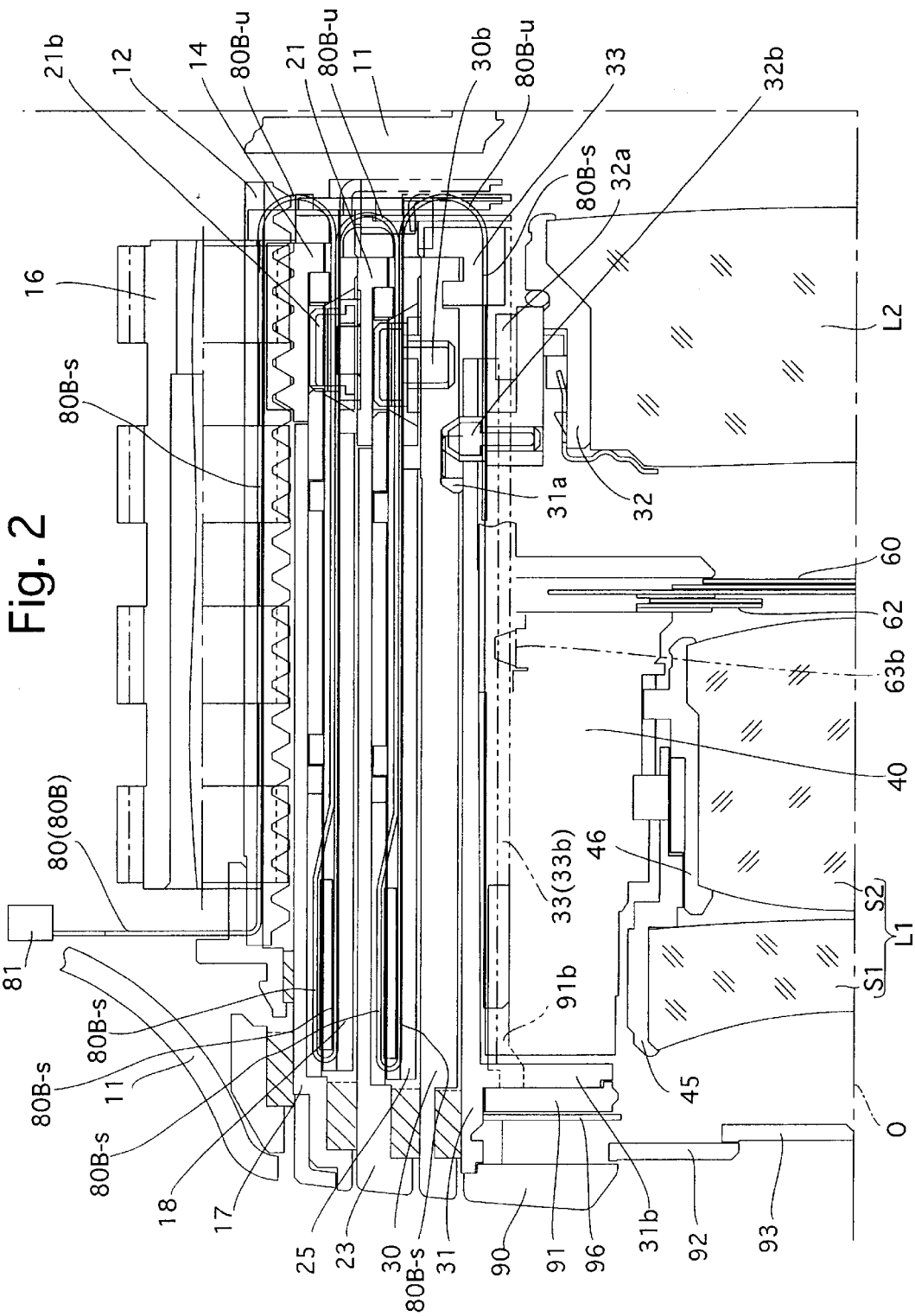
FIG. 2 is a sectional view of an upper half of the zoom lens barrel in a retracted position.

When the zoom lens barrel is in the retracted position (accommodated position) shown in FIG. 2, the driven projection 63b is located in the linear restriction portion 71a. When the zoom lens barrel is advanced to the wide-angle position, the driven projection 63b is still in the linear restriction portion 71a. When the driven projection 63b is in the linear restriction portion 71a, the driven projection 63b causes the aperture defined by the three diaphragm sectors 62 to be at a minimum aperture position. In the minimum aperture position, the diaphragm sectors 62 do not completely close the front portion of the photographing circular opening 44c but cover a predetermined width of the peripheral portion of the circular opening in the radial direction. Consequently, photographing is carried out at the wide-angle extremity without collecting unnecessary light.

When the zoom lens barrel is advanced toward the telephoto side and reaches the fourth focal length step from the wide-angle extremity, the driven projection 63b enters the oblique restriction portion 71b from the linear restriction portion 71a. The oblique restriction portion 71b is inclined so that the diaphragm drive ring 63 is rotated in the diaphragm opening direction as the driven projection 63b is moved toward the restriction releasing portion 71c. Therefore, when the lens barrel is advanced while the driven projection 63 in located in the oblique restriction portion 71b, the diaphragm drive ring 63 is rotated in the diaphragm opening direction to gradually open the diaphragm sectors 62. Specifically, a middle opening degree of the diaphragm sectors 62 is obtained at the fifth focal length step counting from the wide-angle extremity, and the diaphragm sectors 62 are fully opened at the sixth focal length step.

When further advancement of the zoom lens barrel takes place, the above-mentioned switching of the relative distance between the first sub-lens group S1 and the second sub-lens group S2 is carried between the sixth focal length step and the seventh focal length step, so that wide-angle photographing mode is transferred to the telephoto photographing mode. In the telephoto photographing mode, the driven projection 63b is located in the restriction releasing portion 71c. The restriction releasing portion 71c is shaped so as to give less restriction on the relative position of the driven projection 63b. When the driven projection 63b is in the restriction releasing portion 71c, the diaphragm drive ring 63 is held at an angle position to open the diaphragm sectors 62 by the diaphragm drive ring biasing spring 72. Therefore, in the telephoto photographing mode, a sufficient amount of light can be collected.

Conversely, when the zoom lens barrel is moved toward the wide-angle side from the telephoto side, the opening degree of the diaphragm sectors 62 is gradually reduced from the fifth focal length step counting from the wide-angle extremity. The diaphragm sectors 62 are closed in accordance with the relationship between the linear restriction portion 71a and the driven projection 63b, from the fourth focal length step to the wide-angle extremity (first focal length step). Note that the restriction releasing portion 71c has an inclined guide surface 71d which is adapted to smoothly guide the driven projection 63b to the oblique restriction portion 71b when the photographing mode is transferred from the telephoto photographing mode to the wide-angle photographing mode. The inclined guide surface 71d ensures that the driven projection 63b is moved into the oblique restriction portion 71b without interfering with the diaphragm control cam groove 71, even if the angular position of the diaphragm drive ring 63 which has been released at the telephoto photographing mode is slightly out of alignment.

In the rear unit 40B constructed as above, the rotatable shutter drive ring 61 and the rotatable diaphragm drive ring 63 are located substantially in the same position in the axial direction. The shutter drive ring 61 is supported on the inner diameter side of the diaphragm drive ring 63 (see FIG. 15). The diaphragm drive ring 63 is provided on the inner peripheral surface thereof with three inner diameter thrust projections 63c that are spaced in the circumferential direction at equi-angular intervals to rotatably support the shutter drive ring 61. The shutter drive ring 61 is provided on the outer peripheral surface thereof with three outer diameter thrust projections 61d that are spaced in the circumferential direction at equi-angular intervals to engage with the inner diameter thrust projections 63c. The diaphragm drive ring 63 is in contact with the rear surface of the front wall portion 42a of the rear support ring 42 and the rotation transmission dowels 63a are in contact with the front surface of the front wall portion 44a of the sector retainer ring 44, so that the diaphragm drive ring 63 is supported between the rear support ring 42 and the sector retainer ring 44 so as not relatively move in the optical axis direction. The driven projection 63b of the diaphragm drive ring 63 supported between the rear support ring 42 and the sector retainer ring 44 (between the front wall portion 42a and the front wall portion 44a) is located between a pair of rear arms 42b and 44b in the circumferential direction, so that the driven projection 63b can be engaged by the diaphragm control cam groove 71 of the third linear guide ring 33 (see FIG. 10). The shutter drive ring 61 is supported between the rear support ring 42 and the sector retainer ring 44, with the shutter drive ring 61 in contact with the rear surface of the front wall portion 42a and with the outer diameter thrust projections 61d being engaged with the inner diameter thrust projections 63c. The diaphragm drive ring 63 is shaped so that the sector gear 61b (see FIGS. 24 and 25) of the shutter drive ring 61, located inside the diaphragm drive ring 63, can engage with the reduction gear train 68.

Figure 16:
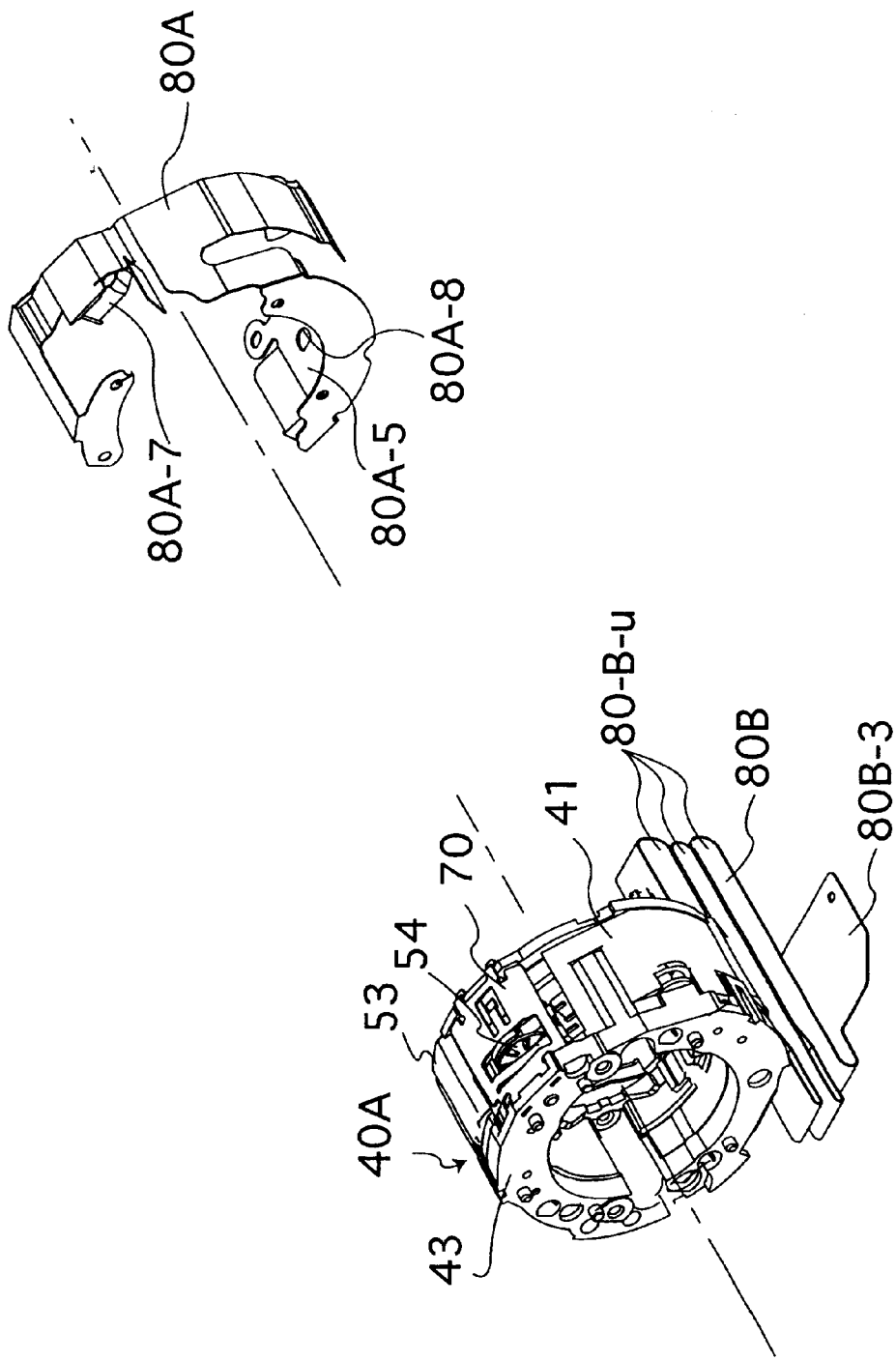
FIG. 16 is a perspective view of a front unit of a lens-shutter unit and a lens-shutter unit FPC (annular FPC)

As can be understood from the above discussion, the lens-shutter unit 40 includes the front unit 40A having the first variable power lens group L1 (first sub-lens group S1 and second sub-lens group S2) and the drive mechanism therefore, and the rear unit 40B having the lens shutter and the diaphragm mechanism. The front unit 40A includes the reversible drive motor 53 for driving the first variable power lens group L1, and the shutter drive motor 67 for opening and closing the shutter sectors 60. The front unit 40A is also provided with the photo-interrupter 56 which detects the shift movement of the first sub-lens group S1 and the second sub-lens group S2 and the movement of the entire first variable power lens group L1 during the focusing operation, and the photo-interrupter 69 which detects the opening and closing operation of the shutter sectors 60. The reversible drive motor 53, the shutter drive motor 67, and the photo-interrupters 56 and 69 are connected to a control circuit 81 (see FIG. 2) in the camera body 11 via a lens-shutter unit FPC (flexible printed circuit) 80. As shown in FIGS. 13 and 16, the lens-shutter unit FPC 80 is divided into an annular FPC 80A extending around the outer peripheral surface of the front unit 40A, and a foldable strip FPC 80B which is elongated in the optical axis direction. The annular FPC 80A is double-sided FPC having circuit patterns printed on upper and lower surfaces thereof. The foldable strip FPC 80B is a one-sided FPC having a circuit pattern printed on only one of upper and lower surfaces thereof.

Figure 4:
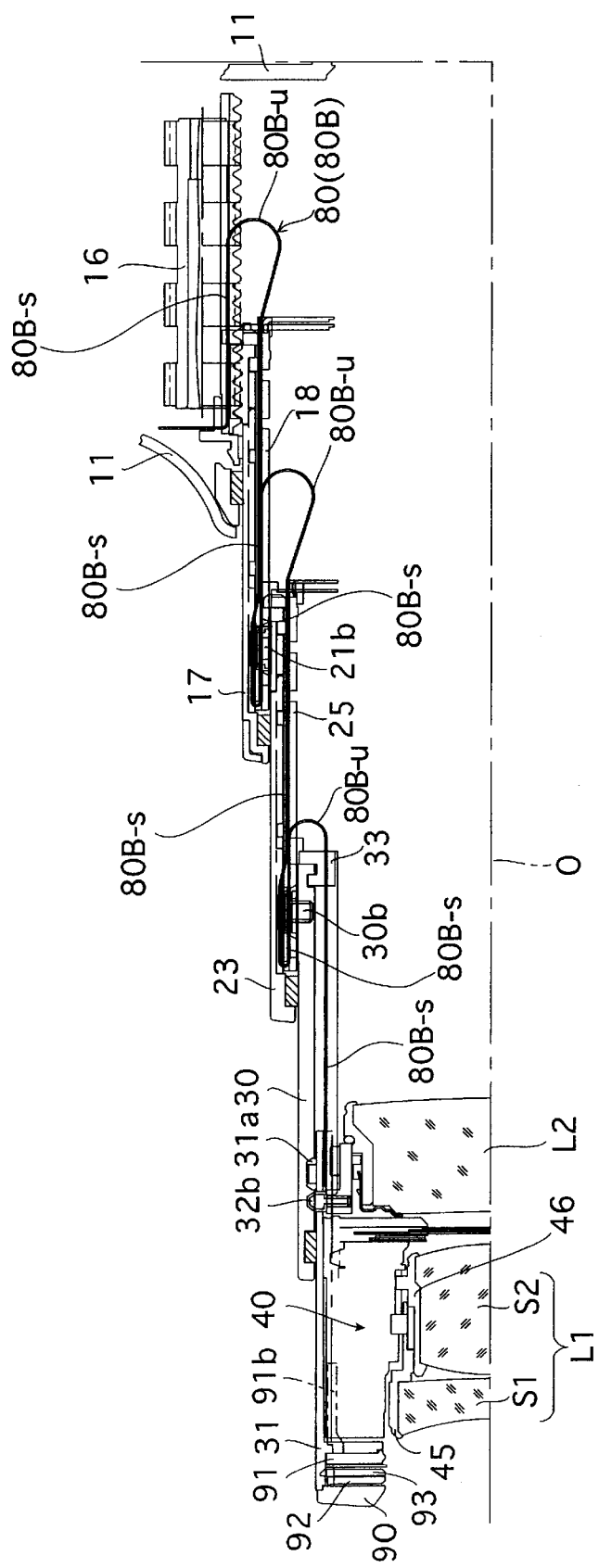
FIG. 4 is a sectional view of an upper half of the zoom lens barrel in a telephoto position.
Figure 5:
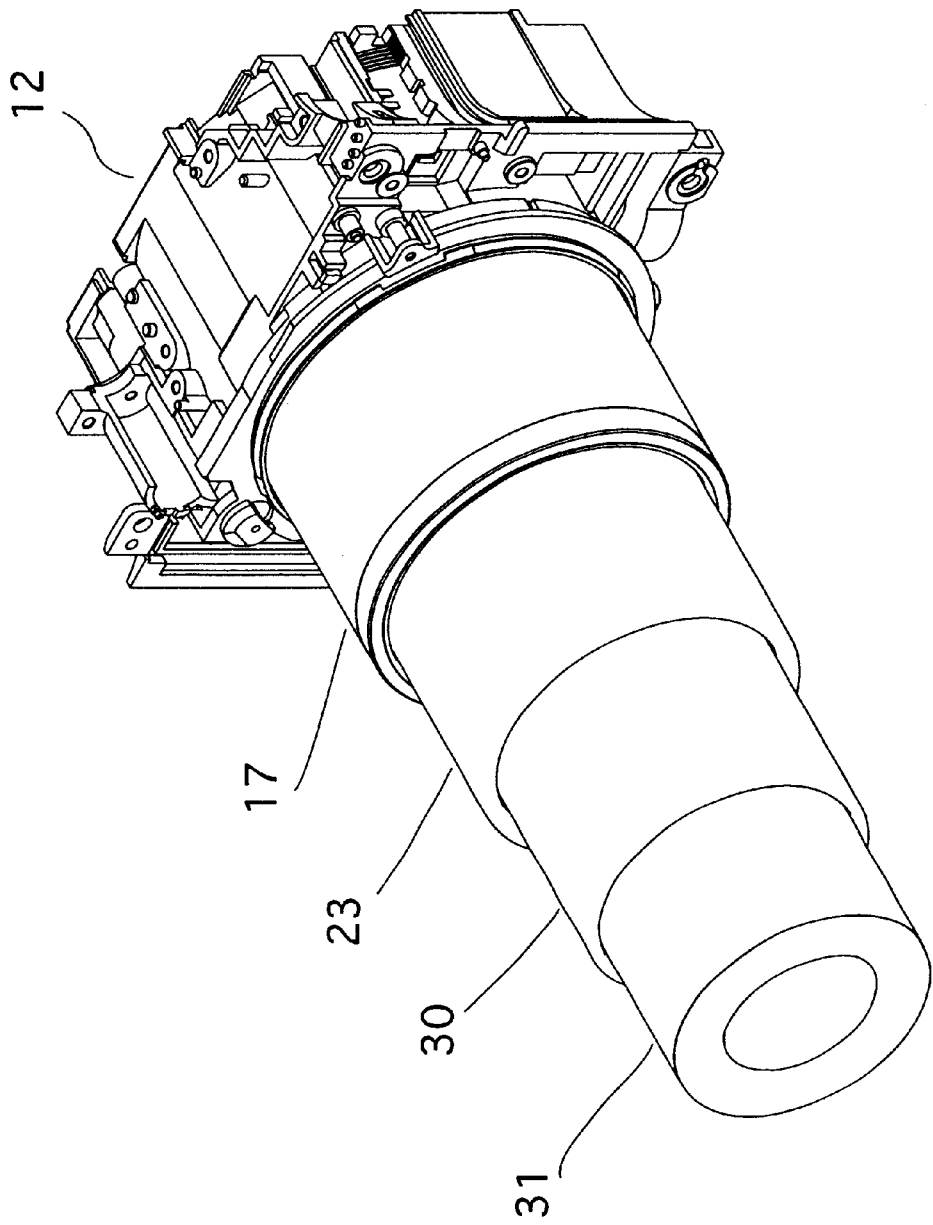
FIG. 5 is a perspective view of the zoom lens barrel in an advanced position.
Figure 6:
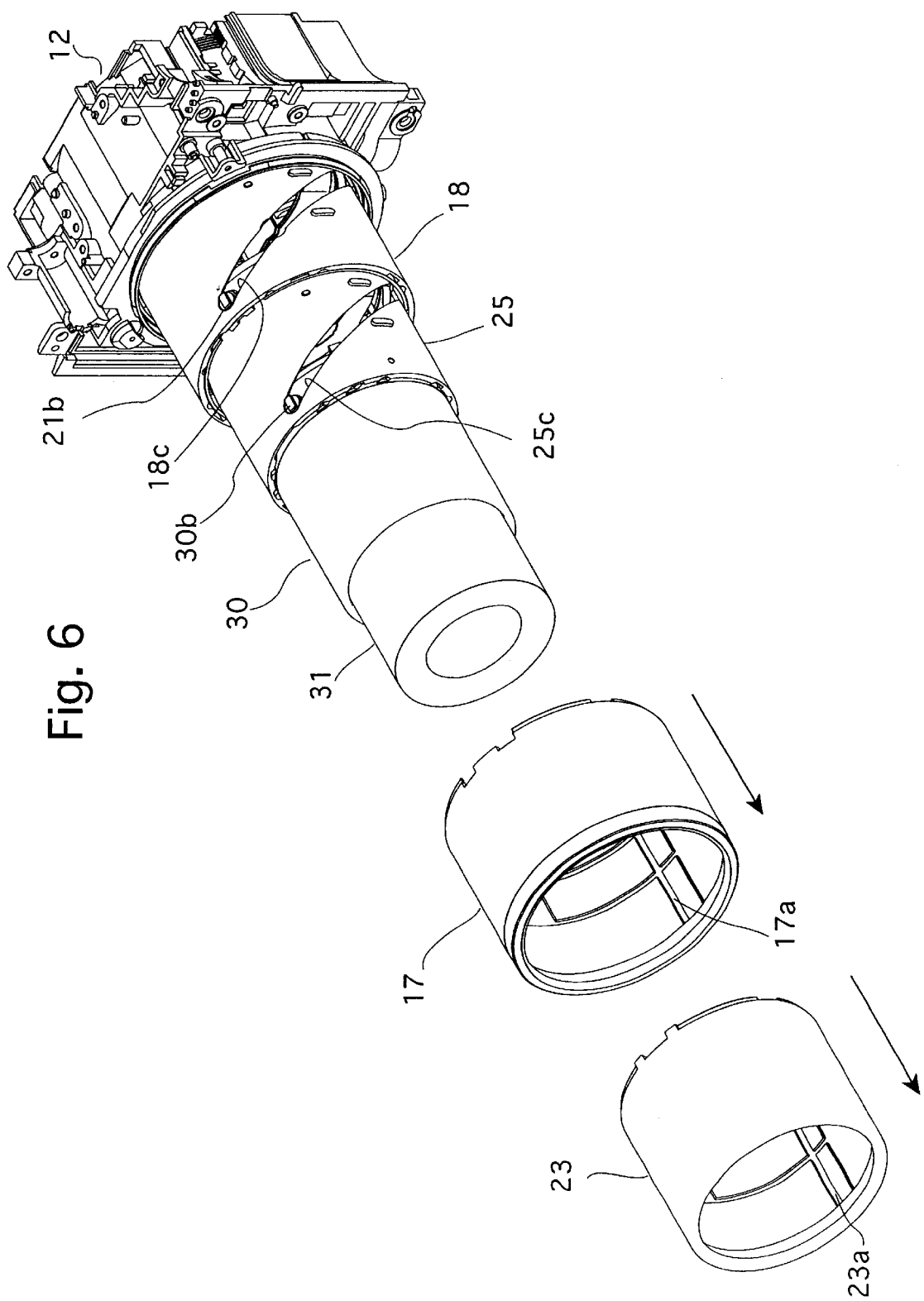
FIG. 6 is an exploded perspective view of the zoom lens barrel shown in FIG. 5.
Figure 7:
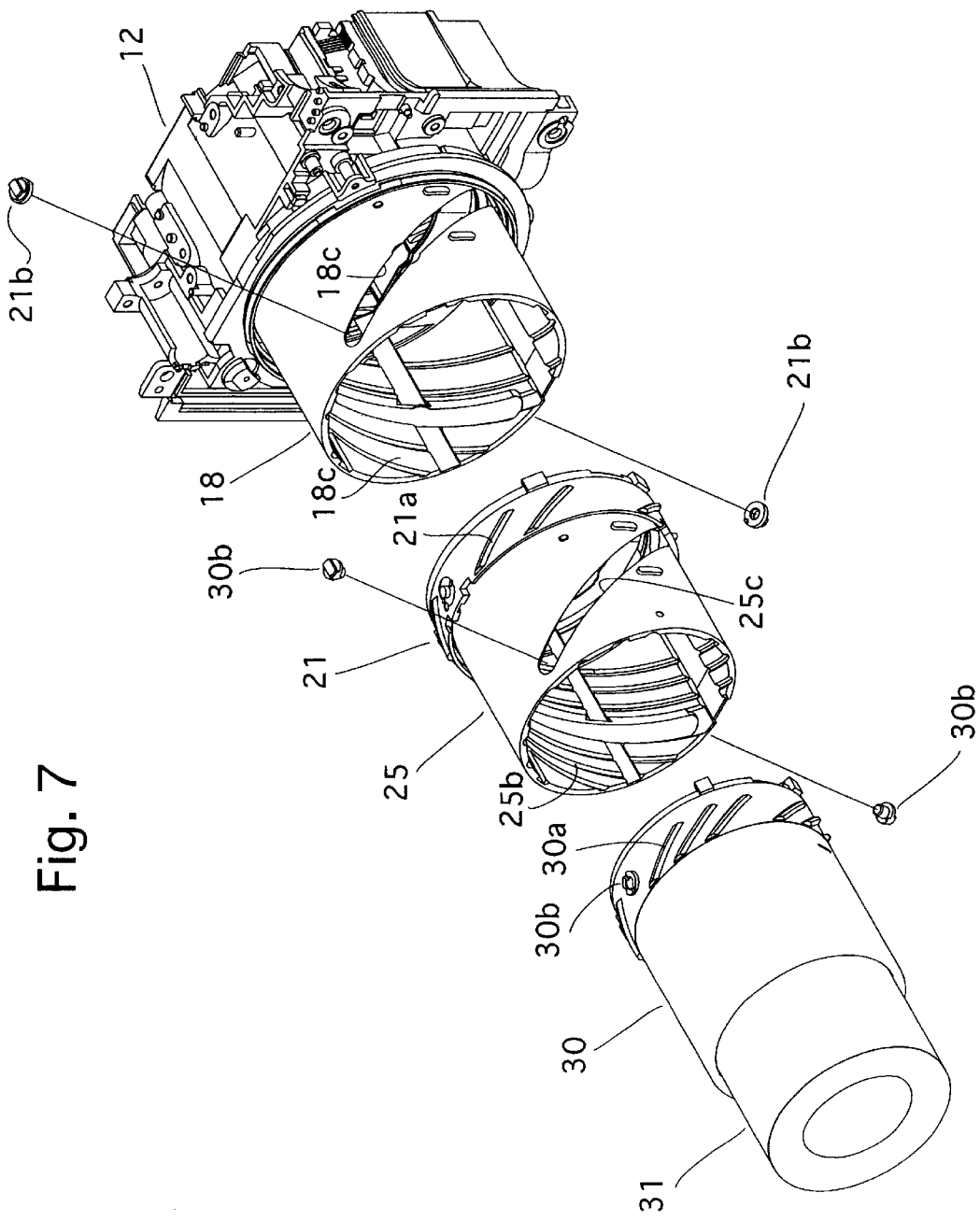
FIG. 7 is an exploded perspective view of the zoom lens barrel, showing a more detailed disassembly than FIG. 6.

The foldable strip FPC 80B is secured at a shutter securing end 80B-1 to the front support ring 41 by a securing screw 82, as shown in FIG. 13. An FPC support plate 83 is inserted between the shutter securing end 80B-1 and the securing screw 82. A cylindrical press-contact support rubber 84 is inserted between the shutter securing end 80B-1 and the front support ring 41. As shown in FIGS. 2 and 4, the foldable strip FPC 80B is connected at the other end to the control circuit 81. The foldable strip FPC 80B can be freely deformed to vary the position of the bent portions and the linear portions thereof in accordance with the relative position of the lens-shutter unit 40 and the control circuit 81 which is changed in accordance with the advance or retraction of the zoom lens barrel, to prevent an interference of the FPC with other members of the lens barrel or the photographing light path. The foldable strip FPC 80B is not connected to the motors (reversible drive motor 53 and the shutter drive motor 67) or the photo-interrupters 56 and 69 when the foldable strip FPC 80B is solely mounted to the front support ring 41. Namely, the motors and the photo-interrupters are connected to the control circuit 81 when the annular FPC 80A is mounted.

Figure 17:
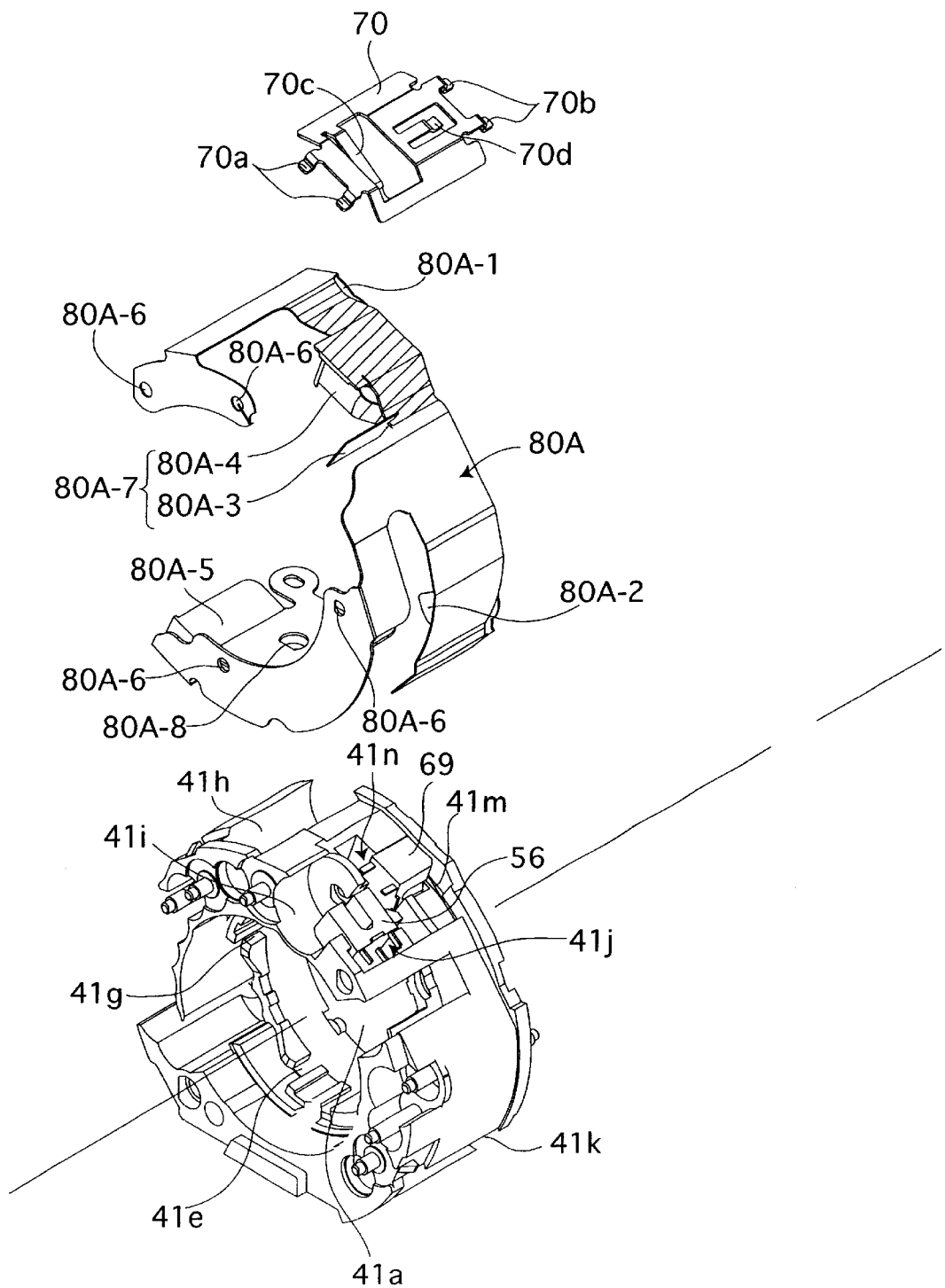
FIG. 17 is an exploded perspective view of a front holder ring and an annular FPC.

As shown in FIG. 17, the annular FPC 80A has two motor terminals 80A-1 and 80A-2 to supply power to the reversible drive motor 53 and the shutter drive motor 67, and two interrupter terminals 80A-3 and 80A-4 to receive the pulses output from the photo-interrupters 56 and 69, respectively. The wiring conductors extending from the terminals are gathered at a press-contact portion 80A-5. The press-contact portion 80A-5 is brought into press contact with the shutter securing end 80B-1 of the foldable strip FPC BOB, so that the wiring conductors of the annular FPC 80A and the foldable strip FPC 80B are connected. Thus, the reversible drive motor 53, the shutter drive motor 67, and the photo-interrupters 56 and 69 are electrically connected to the control circuit 81. The press-contact portion 80A-5 of the annular FPC 80A is fastened together with the shutter securing end 80B-1 of the foldable strip FPC BOB by the securing screw 82, and are secured to the front support ring 41. The annular FPC 80A is also provided with four positioning holes 80A-6 in which front surface projections 43c (see FIGS. 20 and 21) of the gear retainer ring 43 are fitted to determine the position thereof.

The leaf spring cover 70, which holds the photo-interrupters 56 and 69, covers the portion of the annular FPC 80A hatched in FIG. 17 to stably hold the annular FPC 80A.

Figure 26:
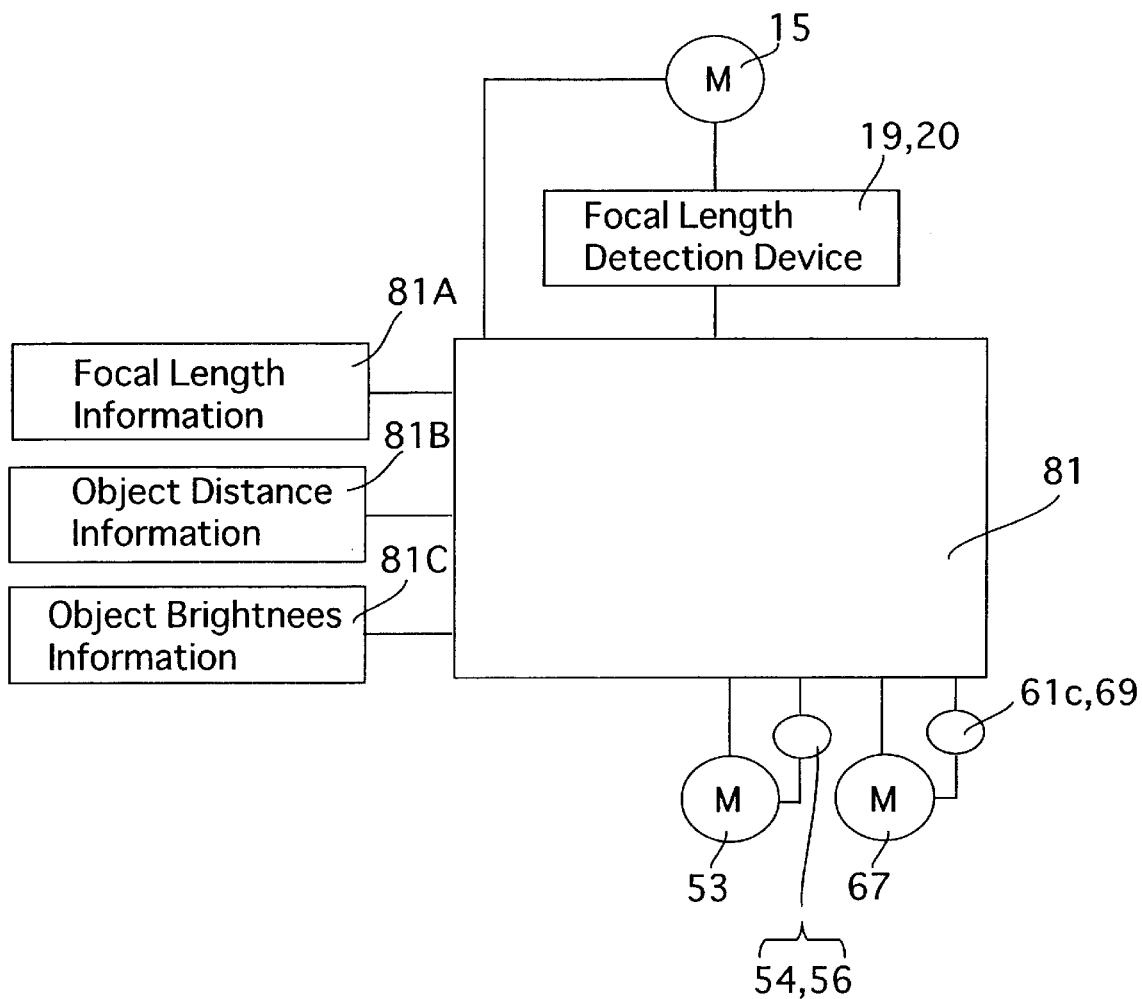
FIG. 26 is a block diagram of a control system of a zoom lens barrel shown in FIGS. 2 through 4.

As shown in FIG. 26, the control circuit 81 controls the zooming motor 15 as well as the reversible motor 53 and the shutter drive motor 67. Focal length information 81A set by an operator (photographer) via a zoom switch (zoom operating device) etc., detected object distance information 81B, object brightness information 81C, angular position information of the cam ring 30 detected by a focal length detection device including the brush 19 and the code plate 20, focusing drive amount information (position switching information of the first sub-lens group S1 and the second sub-lens group S2) detected by the photo-interrupter 56, and opening and closing state information of the shutter sectors 60 detected by the photo-interrupter 69 are input to the control circuit 81. The zooming motor 15, the reversible drive motor 53, and the shutter drive motor 67 are controlled so that the exposure is carried out under the correct exposure conditions at the set focal length, based on the input information. Note that although, in the illustrated embodiment, the shutter sectors 60 function as a shutter and a variable diaphragm, and the diaphragm sectors 62 restrict the aperture size at the wide-angle photographing position, it is possible to use a variable diaphragm mechanism in which the diaphragm sectors 62 are electrically driven by a motor.

The lens-shutter unit 40 is assembled with the members discussed above into a unit which is incorporated in the lens support barrel 31. Namely, the front unit 40A and the rear nit 40B are assembled separately, the two units 40A and 40B are secured using three unit securing screws 39 (see FIG. 13), and the assembly of the units 40A and 40B is mounted into the lens support barrel 31.

Figure 21:
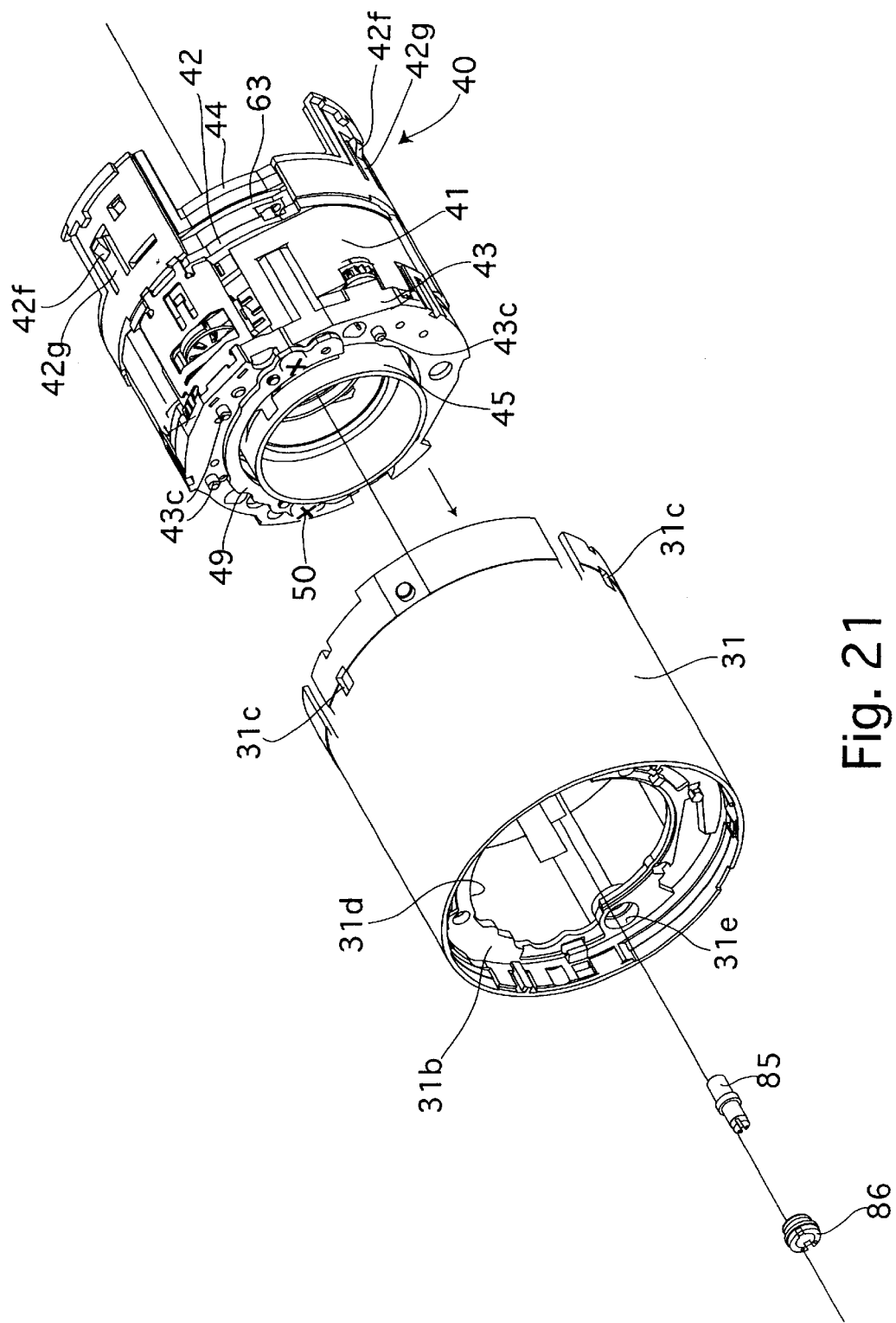
FIG. 21 is an exploded perspective view of a lens-shutter unit and a lens support barrel.

As shown in FIG. 21, the rear support ring 42 of the lens-shutter unit 40 is provided with engagement projections 42f provided on the outer surfaces of the three rear arms 42b. The engagement projections 42f are engaged in the engagement holes 31c of the lens support barrel 31. The engagement projections 42f are formed on resilient tongue portions 42g which are elastically deformable in the radial directions. When the lens-shutter unit 40 is inserted in the direction indicated by an arrow in FIG. 21 into the lens support barrel 31, the engagement projections 42f are moved inwardly by the inner surface of the lens support barrel 31, so that the elastic tongue portions 42g are elastically deformed inwardly. Further insertion o the lens-shutter unit 40 causes the engagement projections 42f to engage in the engagement holes 31c, so that the elastic tongue portions 42g are returned to the initial state, or the inward deformation of the elastic tongue portions 42g is reduced. The cross sectional shape of the engagement projections 42f is such that the elastic tongue portions 42g can be easily deformed inwardly when the lens-shutter unit 40 is inserted forwardly in the optical axis direction, and the lens-shutter unit 40 cannot slip off the lens support barrel 31 in the rearward direction. Therefore, when the engagement projections 42f engage in the engagement holes 31c, the lens-shutter unit 40 is held in the lens support barrel 31. Three lens-shutter unit retainer springs 73 (see FIGS. 1 and 13) are provided between the lens-shutter unit 40 and the lens support barrel 31 to bias the lens-shutter unit 40 rearwardly in the optical axis direction. Accordingly, the axial position of the lens-shutter unit 40 can be accurately determined.

It is possible to adjust the position of the lens-shutter unit 40 in a direction perpendicular to the optical axis, during the assembly of the lens barrel. The lens support barrel 31 is provided on the inner peripheral surface thereof with a substantially annular front wall portion 31b in the vicinity of the front end of the lens support barrel 31. The front wall portion 31b is provided with an insertion hole 31e (see FIG. 21) in which an eccentric member 85 and a direction member 86 are rotatably fitted. The eccentric member 85 is engaged in the gear retainer ring 43 of the lens-shutter unit 40. The eccentric member 85 and the direction member 86 are relatively rotatable. When the direction member 86 is rotated from the front end of the lens support barrel 31, the front end of the eccentric member 85 (the end of the eccentric member engaging with the lens-shutter unit 40) is moved in a plane perpendicular to the optical axis O. Consequently, the position of the lens-shutter unit 40 in the direction perpendicular to the optical axis within the lens support barrel 31 is varied, whereby the position of the first variable power lens group L1 supported by the lens-shutter unit can be adjusted.

The lens support barrel 31 is provided on the front end thereof with a lens barrier mechanism which opens and closes the front opening of the first variable power lens group L1. As shown in FIG. 1, the lens barrier mechanism has a barrier unit including an outer decorative plate 90 secured to the front end of the lens support barrel 31, a barrier retainer ring 96, a pair of outer barrier blades 92 and a pair of inner barrier blades 93 which are rotatably mounted between the barrier retainer ring 96 and the decorative plate 90, and barrier springs 94. A barrier drive ring 91 is supported between the barrier unit and the front end 31b of the lens support barrel 31 so as to be rotatable about the optical axis O. The decorative plate 90 is provided with a projection (not shown) which rotatably supports the outer and inner barrier blades 92 and 93. The outer and inner barrier blades 92 and 93 are rotated about this projection and are associated with each other to carry out the opening and closing operation. The barrier blades 92 and 93 are biased by the barrier springs 94 in a closing direction.

The barrier drive ring 91 is provided with diametrically opposed barrier engagement portions 91a and a driven arm 91b which extends rearwardly in the optical axis direction. The barrier engagement portions 91a engage with the inner barrier blades 93 to transmit the rotation of the barrier drive ring 91 to the inner barrier blades 93. The inner barrier blades 93 are associated with the outer barrier blades 92, and hence, the rotation of the barrier drive ring 91 is transmitted to the outer barrier blades 92 via the inner barrier blades 93. The driven arm 91b extends through a center opening 31d of the front wall portion 31b (see FIG. 21) into the lens support barrel 31. The driven arm 91b can be engaged with an inclined guide surface 33e formed on the front end of the partially cylindrical arm 33b of the third linear guide ring 33.

The barrier drive ring 91 is biased by the drive ring biasing spring 95 in a direction to open the barrier blades 92 and 93. The drive ring biasing spring 95 is stronger than the barrier biasing spring 94, so that the biasing force of the drive ring biasing spring 95 is transmitted to the barrier blades 92 and 93 through the barrier engagement projections 91a to thereby open the barrier blades 92 and 93 against the barrier spring 94 when the barrier drive ring 91 is in a free state. At the wide-angle extremity shown in FIG. 3 and at the telephoto extremity shown in FIG. 4, the driven arm 91b and the inclined guide surface 33e do not come into contact with each other, so that the barrier drive ring 91 is free and, hence, the barrier blades 92 and 93 are open (see FIG. 25). When the zoom lens barrel is moved from the wide-angle extremity to the retracted position shown in FIG. 2, the inclined guide surface 33e of the third linear guide ring 33 engages with the driven arm 91b of the barrier drive ring 91, so that the barrier drive ring 91 is forcedly rotated in a direction against the drive ring biasing spring 95, i.e., in a direction to permit the barrier blades 92 and 93 to be closed, in accordance with the shape of the inclined guide surface 33e. Consequently, the barrier blades 92 and 93 which have been released from the restriction by the barrier drive ring 91 are closed by the spring force of the barrier spring 94 (see FIG. 24).

As mentioned above, in the zoom lens barrel of the present embodiment, the drive ring 47 is rotated to move the first variable power lens group L1 in the optical axis direction to carry out the focusing operation. As indicated by two-dotted chain line in FIG. 25, when the first variable power lens group L1 is moved to the front extremity of the movement for the focusing operation, the front end of the front sub-lens group frame 45 which supports the first sub-lens group S1 is moved to a position located more forward than the axial positions of the barrier blades 92 and 93. Note that FIG. 25 shows the telephoto photographing mode in which the first sub-lens group S1 and the second sub-lens group S2 are in the mutually close position. Likewise, at the wide-angle photographing mode in which the first sub-lens group S1 and the second sub-lens group S2 are in the mutually distant position, the front end of the front sub-lens group frame 45 is moved to a position located more forward than the axial positions of the barrier blades 92 and 93 at the front extremity of the movement for the focusing operation.

The lens-shutter unit (photographing-function unit) 40 discussed above performs a focusing operation in which the first variable power lens group L1 is moved in the optical axis direction, and a switching operation in which the first sub-lens group S1 and the second sub-lens group S2 of the first variable power lens group L1 are moved between a mutually close position and a mutually distant position, for the photographing lens. In the exposure control, the lens-shutter unit 40 performs the opening and closing operation of the shutter sectors (exposure control member) 60 and the diaphragm sectors (exposure control member) 62. The lens-shutter unit 40 has the reversible drive motor (lens drive motor) 53 for carrying out the lens driving operation, and has the shutter drive motor 67 to drive the shutter sectors 60 for the exposure control. The lens-shutter unit 40 is also provided with the photo-interrupter (lens movement detection device) 56 to detect the position of the first variable power lens group L1 (first sub-lens group S1 and the second sub-lens group S2) caused by the driving of the motor 53, and the photo-interrupter (shutter opening detection device) 69 to detect the opening and closing operation of the shutter sectors 60 which is driven by the motor 67.

The reversible drive motor 53, the shutter drive motor 67, the photo-interrupters 56 and 69, which constitute the electric devices provided within the lens-shutter unit 40, are connected to the control circuit 81 in the camera body 11 via the lens-shutter unit FPC (flexible printed circuit) 80. The lens-shutter unit FPC 80 includes the annular FPC (circumferentially extending FPC) 80A extending along the outer peripheral surface of the front unit 40A and the axially elongated foldable strip FPC (axially extending FPC) 80B which can be folded or turned in the optical axis direction. The annular FPC 80A and the foldable strip FPC 80B are constructed separately.

The lens-shutter unit FPC 80 is assembled and disassembled as follows. The lens-shutter unit FPC 80 is mounted to the front unit 40A after the front unit 40A is assembled. To assemble the front unit 40A, the reduction gear train 52 for driving the first variable power lens group L1, the reduction gear train 68 for driving the shutter drive ring 61, and the rotating slit plate 54 are mounted between the front support ring 41 and the gear retainer ring 43. Thereafter, the front support ring 41 and the gear retainer ring 43 are assembled. In this state, the terminal gear 52a of the reduction gear train 52 and the terminal gear 68a of the reduction gear train 68 project from the rear end of the front support ring 41 (see FIG. 18).

Thereafter, the reversible drive motor 53 and the shutter drive motor 67 are inserted into the motor holding recesses 41h and 41k of the front support ring 41. The motors 53 and 67 are inserted in the motor holding recesses 41h and 41k with the pinions 53a and 67a facing forward (toward the gear retainer ring 43). The pinions 53a and 67a engage with the first gears of the reduction gear trains 52 and 68. The motors 53 and 67 are each provided on their rear ends with a pair of terminals 53b and 67b. The terminals 53b and 67b are exposed to the rear side of the front support ring 41 (see FIG. 18). The motor holding recesses 41h and 41k are shaped so that the respective motors 53 and 67 are movable in the insertion direction parallel with the optical axis and are not movable in the radial directions of the lens-shutter unit 40. Consequently, the motors 53 and 67 held in the motor holding recesses 41h and 41k are prevented from slipping out in the outer diameter direction of the front support ring 41.

Moreover, the photo-interrupters 56 and 69 are received in interrupter holding recesses 41j and 41n formed in the outer peripheral surface of the front support ring 41.

Thus, the various elements other than the lens-shutter unit FPC 80 are assembled. Thereafter, the lens-shutter unit FPC 80 is mounted to the assembly.

As mentioned above, the annular FPC 80A is provided with the motor terminal portions 80A-1 and 80A-2 on the rear side of the front support ring 41. The motor terminal portion 80A-1 is secured to the terminal 53b of the reversible drive motor 53, and the motor terminal portion 80A-2 is secured to the terminal 67b of the shutter drive motor 67. Furthermore, the positioning holes 80A-6 formed in the front portion of the annular FPC 80A engage with the front surface projections 43c (see FIG. 20) of the gear retainer ring 43 to stabilize the annular FPC 80A. Moreover, interrupter terminal portions 80A-3 and 80A-4 are connected to the terminal portions 56a and 69a (see FIGS. 27 through 29) provided on the photo-interrupters 56 and 69.

Figure 27:
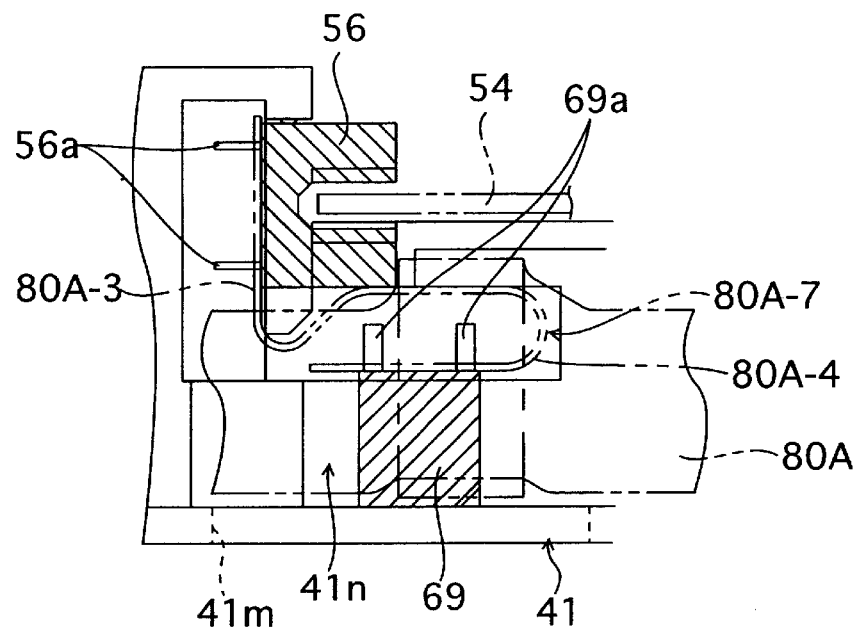
FIG. 27 is a developed view showing a relationship between a photo-interrupter and an FPC in a lens-shutter unit.
Figure 28:
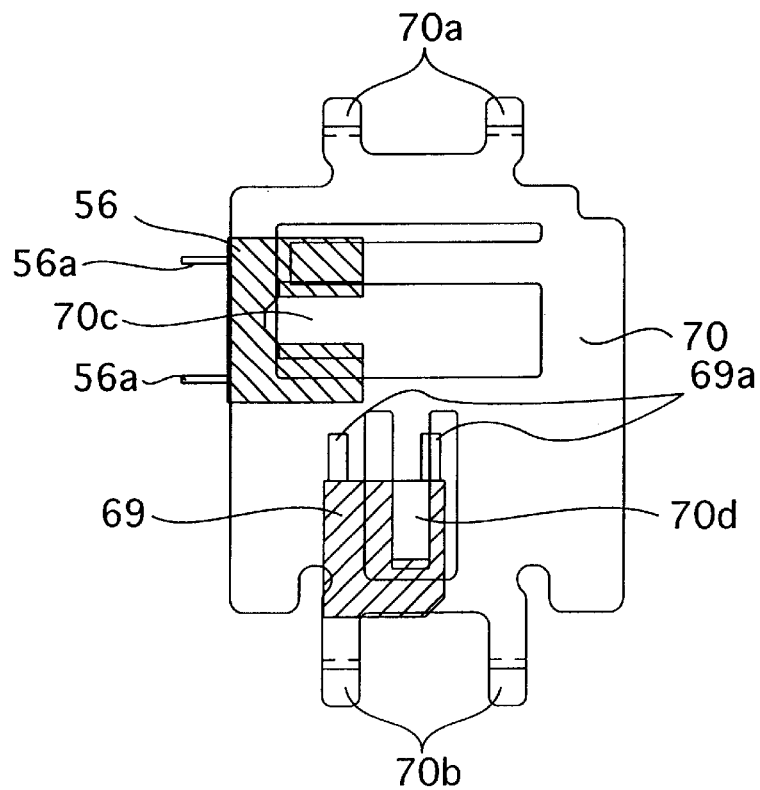
FIG. 28 is a developed view showing a relationship between a leaf spring cover and a photo-interrupter.
Figure 29:
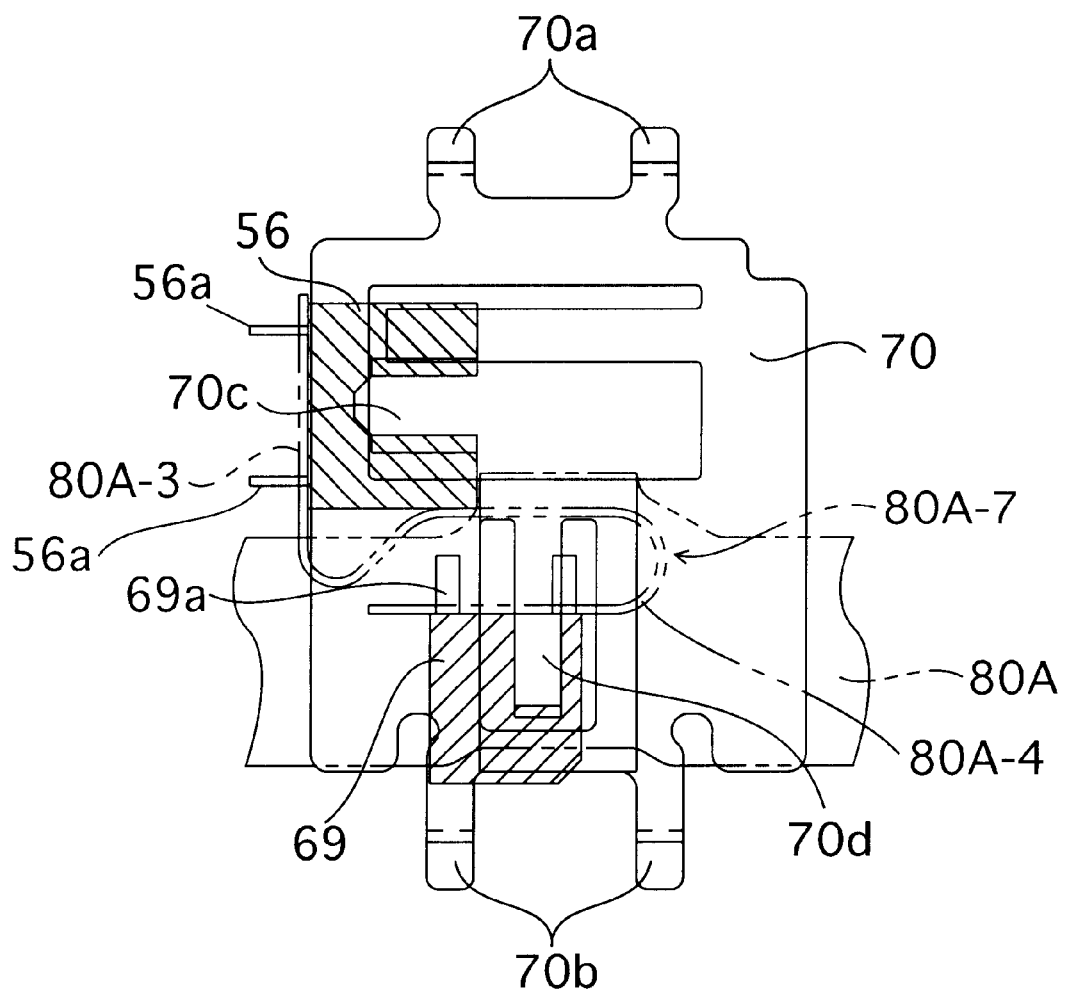
FIG. 29 is a developed view showing a relationship of a photo-interrupter, an FPC and a leaf spring cover.

FIGS. 27 through 29 show a relationship between the interrupter terminal portions 80A-3 and 80A-4, and the photo-interrupters 56 and 69. The annular FPC 80A is provided with an inwardly projecting band-like branch portion 80A-7 which is appropriately bent and is provided on the front end thereof with the interrupter terminal portion 80A-3, and on the intermediate portion with interrupter terminal portion 80A-4.

As shown in FIG. 29, the annular FPC 80A is stably held on the outer peripheral surface of the lens-shutter unit 40 by the leaf spring cover (cover member) 70. The leaf spring cover 70 is mounted to the lens-shutter unit 40 and held between the front unit 40A and the rear unit 40B. As shown in FIGS. 17, 28 and 29, the leaf spring cover 70, made of metal, is provided with a pair of front engagement legs 70a and a pair of rear engagement legs 70b extending in the forward and rearward directions, respectively. The front engagement legs 70a are engaged into a pair of cover engagement pawls 43d (see FIG. 18) formed on the gear retainer ring 43 of the front unit 40A. When the rear unit 40B is secured to the front unit 40A, a pair of rear engagement legs 70b of the leaf spring cover 70 are engaged into a pair of cover engagement pawls 42n (see FIG. 14) formed on the front end of the rear support ring 42, so that the leaf spring cover 70 is secured to the lens-shutter unit 40.

Consequently, the leaf spring cover 70 covers the photo-interrupters 56 and 69, and a portion of the annular FPC 80A including the branch portion 80A-7, as shown in FIG. 29. The leaf spring cover 70 is provided with two resilient tongue portions 70c and 70d which are formed by partly cutting the leaf spring cover 70 in the radial and inward direction (toward the optical axis O). The front end of the resilient tongue portion 70c abuts against the photo-interrupter 56 and the front end of the resilient tongue portion 70d abuts against the photo-interrupter 69. Namely, no upward deformation of the annular FPC 80A in the vicinity of the branch portion 80A-7 takes place. In addition, the leaf spring cover 70 presses onto the photo-interrupters 56 and 69 to prevent them from slipping off.

The annular FPC 80A which lies along the outer surface of the front unit 40A is fastened on the front support ring 41 by the common securing screw 82 together with the foldable strip FPC 80B. Namely, the front support ring 41 is provided on the outer peripheral surface thereof with a receiving surface (not shown) which receives the cylindrical press-contact support rubber 84 placed thereon. The receiving surface of the front support ring 41 is provided with a threaded hole (not shown). The press-contact support rubber 84 is placed on the receiving surface with a center opening 84a thereof corresponding to the threaded hole of the front support ring 41. The press-contact securing portion 80A-5 of the annular FPC 80A and the shutter securing end 80B-1 of the foldable strip FPC 80B are successively positioned over the press-contact support rubber 84. The press-contact securing portion 80A-5 and the shutter securing end 80B-1 are provided with screw insertion holes 80A-8 and 80B-2 (see FIGS. 17 and 13) corresponding to the threaded hole of the front support ring 41 and the center opening 84*a* of the press-contact support rubber 84, respectively. Moreover, the press-contact securing portion 80A-5 and the shutter securing end 80B-1, which overlap each other, are covered by the FPC support plate 83 (see FIG. 13). The FPC support plate 83 has a center opening 83*a* similar to the center opening of the press-contact support rubber 84. The securing screw 82 is inserted through the center opening 83*a* of the FPC support plate 83, the screw insertion holes 80A-8 and 80B-2 of the annular FPC 80A and the foldable strip FPC 80B, and the center opening 84*a* of the press-contact support rubber 84, so that when the securing screw 82 is screwed into the threaded hole of the front support ring 41, the annular FPC 80A and the foldable strip FPC 80B are fastened together and are secured to the front support ring 41.

The press-contact securing portion 80A-5 and the shutter securing end 80B-1 are secured in a press-contact state by the securing screw 82. The printed circuits are exposed to the contact surfaces of the press-contact securing portion 80A-5 and the shutter securing end 80B-1, so that when the press-contact securing portion 80A-5 and the shutter securing end 80B-1 are brought into press-contact, the circuits of the annular FPC 80A and the foldable strip FPC 80B are connected. Namely, the annular FPC 80A and the foldable strip FPC 80B function as the single lens-shutter unit FPC 80. The motors 53 and 67 and the photo-interrupters 56 and 69 are connected to the control circuit 81 by connecting the control circuit connecting end 80B-3 (see FIGS. 13, 16 and 18) of the foldable strip FPC 80B to the control circuit 81.

Figure 3:
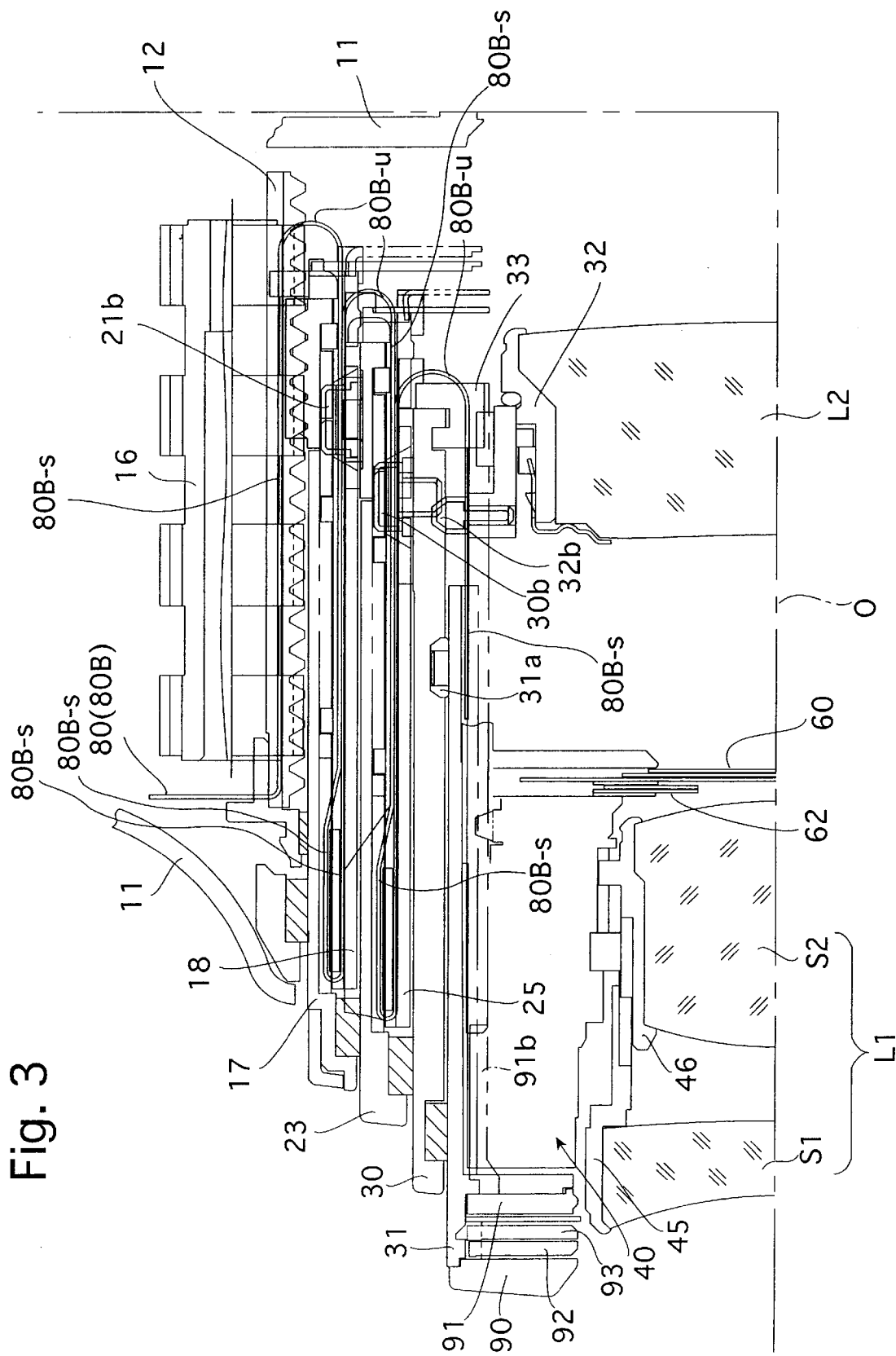
FIG. 3 is a sectional view of an upper half of the zoom lens barrel in a wide-angle position.

The shutter securing end 80B-1 of the foldable strip FPC 80B is pressed onto the press-contact securing portion 80A-5 of the annular FPC 80A, after the control circuit connecting end 80B-3 is connected to the control circuit 81. Conversely, it is possible to connect the control circuit connecting end 80B-3 to the control circuit 81 after the shutter side securing end 80B-1 is connected to the press-contact securing portion 80A-5. The foldable strip FPC 80B, which is connected at the opposed ends thereof to the lens-shutter unit 40 and the control circuit 81, is provided with six straight portions 80B-s which substantially extend in the optical axis direction and three U-shaped portions (folded portions) 80B-u which are folded in the optical axis direction and connect with the straight portions 80B-s so as to correspond to the internal elements of the zoom lens barrel, as shown in FIGS. 2 through 4. The length of the straight portions 80B-s and the position of the U-shaped portions 80B-u are varied in accordance with the zooming operation of the zoom lens barrel.

When the lens-shutter unit FPC 80 is removed, the screw 82 is unscrewed from the threaded hole of the front support ring 41, so that the annular FPC 80A and the foldable strip FPC 80B can be detached from each other in the order opposite to that of the assembling operation as discussed above. Consequently, the foldable strip FPC 80B is removed from the lens-shutter unit 40, and only the annular FPC 80A is attached along the outer periphery of the lens-shutter unit 40.

The lens-shutter unit FPC 80 includes two separate members, i.e., the annular FPC 80A and the strip FPC 80B and functions as a single FPC for the lens-shutter unit 40 when the annular FPC 80A and the foldable strip FPC 80B are interconnected in a press-contact state. With this structure, the assembling or disassembling operation or an adjustment of the lens-shutter unit 40 can be facilitated.

For example, when the connecting terminals (80A-1, 80A-2, 80A-3, 80A-4) of the lens-shutter unit FPC 80 are connected to the motors 53 and 67 or the photo-interrupters 56 and 69 in the front unit 40A, if the portion corresponding to the elongated foldable strip FPC 80B is made integral with the remaining portion, the operability is reduced. However, in the illustrated embodiment, the assembling, disassembling or adjustment operation can be carried out while the annular FPC 80A is separated from the foldable strip FPC 80B. Moreover, when the lens-shutter unit 40 is removed from the lens barrel for the purpose of repair of the elements of the lens-shutter unit or examination of the functions of the function elements, the detachment of the foldable strip FPC 80B from the annular FPC 80A makes it possible to carry out the necessary operations easily.

Since the annular FPC 80A, which is connected to the electric devices in the lens-shutter unit 40, and the elongated foldable strip FPC 80B, which is an intermediate portion whose shape is varied in accordance with advancing or retreating movement of the lens barrel, are made of separate pieces, the flexibility of the FPC or the circuit arrangement can be freely determined. For instance, in the illustrated embodiment, the annular FPC 80A provided around the outer periphery of the lens-shutter unit 40 is a double-sided FPC whose substrate is provided on the upper and lower surfaces thereof with printed circuits which can be effectively connected to the electric elements, such as the motors or the photo-interrupters in the front unit 40A. A double-sided FPC is less flexible than a single-sided FPC whose substrate is provided with a printed circuit only on one side. Therefore, if the foldable strip FPC 80B whose shape is varied in accordance with the zooming operation is made of a double-sided FPC, a smooth change in the shape cannot be ensured, thus resulting in an interference with other components of the lens barrel or a resistance to the movement of the lens barrel during zooming. However, in the present embodiment in which the elongated foldable strip FPC 80B is made of a separate piece from the annular FPC 80A, the foldable strip FPC 80B can be made of a flexible single-sided FPC. Namely, in the present embodiment, the annular FPC (circumferentially extending FPC) 80A which is supported by the outer peripheral surface of the lens-shutter unit 40 and which is fundamentally not deformed, and the foldable strip FPC (axially extending FPC) 80B which must be highly flexible so as to smoothly deform in accordance with the movement of the lens barrel, can be independently and respectively made of an appropriate kind of FPC; i.e., a single-sided or a double-sided FPC.

However, the present invention is not limited to the illustrated embodiments. For instance, it is possible for the photographing-function unit (lens-shutter unit) to include a functional member (electric device or element) which differs from the motors 53 and 67, or the photo-interrupters 56 and 69 of the illustrated embodiment, wherein the circumferentially extending FPC is connected to the different function member.

Namely, the present invention can be applied to any photographing-function unit which has at least one of the movable photographing lens and the exposure control member. Although the lens-shutter unit 40 has the first variable power lens group L1 which is movable in the optical axis direction, the shutter mechanism, and the diaphragm mechanism, in the illustrated embodiment, the FPC mounting structure of the present invention can be applied to a photographing-function unit having only the lens-drive mechanism or only the exposure control member, such as the shutter or the diaphragm drive mechanism, which is connected to the control circuit through the FPC.

The movable lens group of the photographing-function unit is not limited to that of the illustrated embodiment. For example, the first variable power lens group L1 in the lens-shutter unit 40 can carry out not only the focusing operation in which the first sub-lens group S1 and the second sub-lens group S2 are moved together, but also the switching operation to vary the mutually distance between the first sub-lens group S1 and the second sub-lens group S2, in the illustrated embodiment. The present invention can be equally applied to a photographing-function unit in which the lens group performs the focusing operation only.

Furthermore, the exposure control member of the photographing-function unit is not limited to that of the illustrated embodiment. For example, in the lens-shutter unit 40 of the illustrated embodiment, the shutter sectors 60 are driven by the motor 53, and the diaphragm sectors 62 mechanically varies the aperture diameter in accordance with the zooming operation of the zoom lens. However, the present invention can be applied to a photographing-function unit in which the diaphragm is driven in addition to the shutter by the motor 53. Moreover, the present invention can be applied to a photographing-function unit which has only the shutter or the diaphragm.

As can be understood from the foregoing, in the FPC mounting structure to connect the photographing-function unit, such as the lens shutter and the control circuit, the assembling and disassembling operation can be facilitated. Moreover, an FPC mounting structure can be obtained which can be advantageously applied to a photographing-function unit, such as a lens shutter, which is moved relative to the control circuit.

Obvious changes may be made in the specific embodiments of the present invention described herein, such modifications being within the spirit and scope of the invention claimed. It is indicated that all matter contained herein is illustrative and does not limit the scope of the present invention.

What is claimed is:

1. An FPC mounting structure for a lens shutter including a lens-shutter unit having therein a photographing lens and a shutter, and an FPC which is adapted to connect said lens shutter-unit to a control circuit, said FPC comprising:
   a circumferentially extending FPC which is supported along an outer peripheral surface of said lens-shutter unit; and
   an axially extending FPC which extends in the optical axis direction and which is connected to said control circuit;
   wherein said circumferentially extending FPC and said axially extending FPC are constructed separately and are connected to each other in a press-contact state.

2. The FPC mounting structure for a lens shutter according to claim 1, wherein said circumferentially extending FPC comprises a double-sided FPC which is provided on upper and lower surfaces thereof with printed circuits; and
   wherein said axially extending FPC comprises a single-sided FPC which is provided on one surface thereof with a printed circuit.

3. The FPC mounting structure for a lens shutter according to claim 1, wherein said circumferentially extending FPC and said axially extending FPC are secured to said lens-shutter unit by a common screw in press-contact state.

4. The FPC mounting structure for a lens shutter according to claim 1, further comprising a cover member which is attached to the outer peripheral surface of said lens-shutter unit to hold said circumferentially extending FPC to the outer peripheral surface of said lens-shutter unit.

5. The FPC mounting structure for a lens shutter according to claim 1, wherein said lens-shutter unit comprises:
   a lens drive motor which moves said photographing lens in the optical axis direction within said lens shutter unit;
   a lens movement detection device which detects the position of said photographing lens moved by said lens drive motor;
   a shutter drive motor which opens and closes said shutter; and
   a shutter opening detection device which detects the opening state of said shutter;
   wherein said circumferentially extending FPC is connected to said lens drive motor, said lens movement detection device, said shutter drive motor, and said shutter opening detection device.

6. The FPC mounting structure for a lens shutter according to claim 1, wherein said lens-shutter unit is provided in a zoom lens barrel and is moved in the optical axis direction by a zooming operation of said zoom lens barrel;
   wherein said axially extending FPC is provided with at least one pair of straight portions which extend in the optical axis direction and at least one folded portion which connects with said pair of straight portions, wherein the position of said folded portion is varied in accordance with the movement of said lens-shutter unit in the optical axis direction.

7. An FPC mounting structure, in which a photographing-function unit which has at least one of a photographing lens movable in the optical axis direction and an exposure control member, connected to a control circuit which controls said photographing-function unit via an FPC, said FPC comprising:
   a circumferentially extending direction FPC which is supported along an outer peripheral surface of said photographing-function unit; and
   an axially extending FPC which extends in the optical axis direction and is connected to said control circuit;
   wherein said circumferentially extending FPC and said axially extending FPC are constructed separately and are connected to each other in a press-contact state.

8. The FPC mounting structure according to claim 7, wherein said circumferentially extending FPC comprises a double-sided FPC which is provided on the upper and lower surfaces thereof with printed circuits; and
   wherein said axially extending FPC comprises a single-sided FPC which is provided on one surface thereof with a printed circuit.

9. The FPC mounting structure according to claim 7, wherein said circumferentially extending FPC and said axially extending FPC are secured to said photographing-function unit by a common screw in a press-contact state.

10. The FPC mounting structure according to claim 7, further comprising a cover member which is attached to the outer peripheral surface of said photographing-function unit to hold said circumferentially extending FPC to the outer peripheral surface of said photographing-function unit.

11. The FPC mounting structure according to claim 7, wherein said exposure control member comprises a shutter.

12. The FPC mounting structure according to claim 7, wherein said exposure control member comprises a diaphragm.

13. The FPC mounting structure according to claim 7, wherein said exposure control member comprises a shutter and a diaphragm.

* * * * *